United States Patent [19]

Templeton et al.

[11] Patent Number: 5,128,230
[45] Date of Patent: Jul. 7, 1992

[54] QUINONE DIAZIDE CONTAINING PHOTORESIST COMPOSITION UTILIZING MIXED SOLVENT OF ETHYL LACTATE, ANISOLE AND AMYL ACETATE

[75] Inventors: Michael K. Templeton, St. Ann; Anthony Zampini; Peter Trefonas, III, both of St. Louis; James C. Woodbrey, Chesterfield; David C. Madoux, Maryland Heights; Brian K. Daniels, Chesterfield, all of Mo.

[73] Assignee: Shipley Company Inc., Newton, Mass.

[21] Appl. No.: 644,752

[22] Filed: Jan. 23, 1991

Related U.S. Application Data

[63] Continuation of Ser. No. 411,670, Sep. 25, 1989, abandoned, which is a continuation of Ser. No. 108,192, Oct. 13, 1987, abandoned, which is a continuation-in-part of Ser. No. 2,364, Dec. 23, 1986, abandoned.

[51] Int. Cl.$^5$ .................. G03F 7/023; G03C 1/61
[52] U.S. Cl. .................. 430/191; 430/165; 430/166; 430/190; 430/192; 430/193
[58] Field of Search ............ 430/189, 190, 191, 192, 430/193, 165, 166

[56] References Cited

U.S. PATENT DOCUMENTS

| | | | |
|---|---|---|---|
| 3,201,239 | 8/1965 | Neugebauer et al. | 430/165 |
| 3,869,292 | 3/1975 | Peters | 430/192 |
| 3,890,152 | 6/1975 | Ruckert et al. | 430/157 |
| 4,008,084 | 2/1977 | Ikeda et al. | 430/276 |
| 4,144,067 | 3/1979 | Ruckert et al. | 430/324 |
| 4,164,421 | 8/1979 | Shinozaki et al. | 430/191 |
| 4,421,841 | 12/1983 | Shimizu et al. | 528/293 |
| 4,439,516 | 3/1984 | Cornigliaro et al. | 430/323 |
| 4,499,171 | 2/1985 | Hosaka et al. | 430/192 |
| 4,504,567 | 3/1985 | Yamamoto et al. | 430/191 |
| 4,587,196 | 5/1986 | Toukhy | 430/192 |
| 4,626,491 | 12/1986 | Gray | 430/192 |
| 4,626,492 | 12/1986 | Eibeck | 430/191 |
| 4,639,406 | 1/1987 | Stahlhofen | 430/165 |
| 4,719,167 | 1/1988 | Miura et al. | 430/192 |
| 4,845,008 | 7/1989 | Nishioka et al. | 430/192 |

FOREIGN PATENT DOCUMENTS

| | | | |
|---|---|---|---|
| 118291 | 9/1984 | European Pat. Off. | 430/192 |
| 148787 | 7/1985 | European Pat. Off. | 430/193 |
| 211667 | 2/1987 | European Pat. Off. | 430/191 |
| 2323170 | 1/1977 | France | 430/192 |
| 51-28001 | 3/1976 | Japan . | |
| 61-45240 | 3/1986 | Japan | 430/192 |
| 2023858 | 1/1980 | United Kingdom | 430/91 |

OTHER PUBLICATIONS

English translation of Japanese Publication No. 60-121,445 published Jun. 1985 (Hosaka et al.).
Weast, Robert C., "Handbook of Chemistry & Physics", 53rd Ed., 1973, pp. C-82, C-162 and C-450.
English Translation of French Patent Publication #609,590, published Jan. 1977 (Tabot et al—P.D.I.).
Pampalone, *Solid State Technology*, "Novolak Resins Used in Positive Resist Systems", Jun. 1984, pp. 115–120.
Partial English Translation of Japanese Kokai #60-24545, published Feb. 1985 (Hosako et al.).

*Primary Examiner*—Richard L. Schilling
*Assistant Examiner*—Christopher G. Young
*Attorney, Agent, or Firm*—Robert L. Goldberg; Peter F. Corless

[57] ABSTRACT

This invention is directed to novel photoresist processes and compositions having high resolution novalac resins, high resolution photoactive components with several diazoquinone groups per molecule, and solvents having a high solvency power, better safety, improved photospeed, higher contrast and equivalent cast film thickness from lower percent solids formulations.

9 Claims, 2 Drawing Sheets

DISSOLUTION RATE OF PHOTORESIST COMPOSITION AS A FUNCTION OF THE TOTAL PHOTOPRODUCT CONCENTRATION, $m^*$

DISSOLUTION RATE OF PHOTORESIST COMPOSITION AS A FUNCTION OF THE CONCENTRATION OF THE TRI-INDENE CARBOXYLIC ACID ESTER PHOTOPRODUCT CONCENTRATION, $m_3$

QUINONE DIAZIDE CONTAINING PHOTORESIST COMPOSITION UTILIZING MIXED SOLVENT OF ETHYL LACTATE, ANISOLE AND AMYL ACETATE

This is a continuation of copending application Ser. No. 07/411,670 filed on Sep. 15, 1989, now abandoned which is a continuation of co-pending application Ser. No. 07/108,192 filed on Oct. 13, 1987, now abandoned which is a continuation-in-part of application Ser. No. 002,364, field Dec. 23, 1986, abandoned.

BACKGROUND OF THE INVENTION

1 Field of the invention

This invention relates to a photoresist process and to photoresist compositions comprising a soluble resin, a photosensitizer and a solvent. Particularly, this invention relates to a photoresist process having advantages including high resolution capability and to improved components of photoresist compositions, such as resins, photosensitive components and solvents.

2. Description of Prior Art

Various attempts have been made in the prior art to improve selected properties of photoresist compositions by using selected novolac resin formulations. For example, in U.S. Pat. Nos. 4,377,631, 4,529,682 and 4,587,196, specific novolac resins made from mixtures containing meta- and para-cresols or ortho-, meta- and para-cresols were described as having utility in positive photoresist compositions with increased photospeed. In U.S. Pat. No. 4,551,409, a naphthol containing resin and mixtures of the naphthol resin with another compatible resin are used in photoresist compositions to increase the heat distortion temperature of the photoresist. These prior-art compositions, while providing improved photospeed and improved thermal properties, do not provide particularly high contrast and resolution. This is a significant drawback in many industrial manufacturing processes for electronic circuit components that require fine-line resolution.

In *Materials for Microlithography*, L. F. Thompson, G. G. Wilson, and J. M. Frechet; Eds.; ACS Symposium Series 266, American Chemical Society, Washington, D.C., 1984, Chapter 17, p 339., a metacresol-benzaldehyde novolac resin was formulated with a photosensitizer and solvent to produce positive-toned images when the photoresist mixture was applied to a silicon wafer, exposed to actinic radiation and subsequently developed. However, the synthesis of the novolac resin, as taught, produces a material having low molecular weight, and photoresist compositions based on it have low photospeeds and resolution.

Also, it is well known in the art to produce positive photoresist formulations such as those described in U.S. Pat. Nos. 3,666,473 and 4,409,314 and European Patent Application 0092444. These include alkali-soluble phenolic-formaldehyde novolac resins together with light-sensitive materials. Examples of the light sensitive materials are diazoquinones (DAQs) such as the sulfonate and carboxylate esters and the sulfon- and carbonamides obtained by reacting, respectively, oxo-diazonaphthalene sulfonyl and carbonyl halides with hydroxy, polyhydroxy, amino and polyamino ballast compounds (See U.S. patent application 174,556 filed on Jul. 18, 1950 by Maximillian Paul Schmidt and now abandoned, and U.S. Pat. Nos. 3,046,110, 3,046,122 and 3,046,123). The resins and sensitizers are dissolved in an organic casting solvent or mixture of casting solvents and are applied as a dried thin film or coating to a substrate suitable for the particular application desired.

The resin component of these photoresist formulations is soluble in aqueous alkaline solutions, but the admixed naphthoquinone sensitizer acts as a dissolution inhibitor with respect to the resin. Upon exposure of selected areas of a coated substrate to actinic radiation, the sensitizer undergoes a radiation induced chemical transformation, and the exposed areas of the coating are rendered more soluble than the unexposed area. This difference in solubility rates causes the exposed areas of the photoresist coating to be dissolved when the substrate is immersed in alkaline developing solution, while the unexposed areas are largely unaffected. This produces a positive relief resist pattern on the substrate. In most instances, the imagewise-exposed and developed resist pattern resulting on the substrate will be subjected to treatment by a substrate-etchant process. The photoresist pattern on the substrate protects the resist coated areas of the substrate from the etchant, and thus the etchant is only able to etch the remaining uncoated areas of the substrate which, in the case of a positive photoresist, correspond to the areas previously exposed to actinic radiation. Thus, an etched pattern can be created on the substrate which corresponds to the pattern of the mask, stencil, template, etc., that was used to create the latent images in the resist prior to development. The relief pattern of photoresist on the substrate produced by the method just described is useful for various applications, including the manufacture of miniaturized The term PAC as used in this present invention refers to the photoactive component of the resist composition. The PAC generally is sensitive to energetic forms of radiation such as ultraviolet (UV) light, undergoing radiation-induced chemical transformations upon exposure to such radiation.

The properties of a photoresist composition which are important in commercial practice include the photospeed of the resist, development contrast and resist resolution capability and resist sidewall angle or wall profile, and resist adhesion. Increased photospeed is important for a photoresist, particularly in applications where light of reduced intensity is employed such as in projection exposure techniques where the light is passed through a series of lenses and monochromatic filters. Development contrast is a measure of the photoresist's ability to faithfully transfer the mask dimensions through the entire thickness of the photoresist. Ideally the opening at the top of the photoresist film should have the same dimensions as at the bottom of the film. A resist with enhanced contrast generally has improved edge acuity and enhanced resolution capability.

Resist resolution refers to the capability of a resist system to reproduce with a given phototool the smallest multiple equal line/space features of a mask which is utilized during exposure with a high degree of image edge acuity in the developed spaces. In many industrial applications, particularly in the manufacture of miniaturized electronic components, a photoresist is required to provide a high degree of resolution for very narrow lines and spaces. The ability of a resist to reproduce very small dimensions, on the order of a micron or less, is extremely important in the production of very large scale integrated (VLSI) electronic circuits on silicon chips. Circuit density on such a chip can only be increased, assuming lithographic techniques are utilized, by increasing the resolution capabilities of the resist.

Various attempts have been made in the prior art to alter photoresist compositions in order to improve photoresist properties. For example, U.S. Pat. No. 4,688,670 describes a triester-DAQ (tri-DAQ) PAC which achieves a moderate contrast. The composition described contains a PAC and a resin of different chemical structures than those of the present invention, resulting in inferior performance properties.

European Patent Application 85300184.0 describes several photoresist compositions containing polyester DAQ (poly-DAQ) PACs. Many of the PACs claimed in said patent application have only minimal solubility and aging stability in useful photoresist solvents. An overwhelming majority of the PACs in said patent application are esters of highly absorbant hydroxy-functional ballast molecules which have the property of a high absorbance and high non-bleachable absorbance. The absorbance properties of such compositions degrade resolution capabilities. Many of the PACs claimed in said patent application absorb in the visible spectrum, degrading mask alignment techniques. Also, an overwhelming majority of said photoresist compositions in said patent application have the property of poor yield of unexposed (or slightly exposed) film thickness remaining after development: i.e., in the range of 87-93 percent. The compositions taught in said patent application are different from those of the present invention with respect to PAC structure, PAC performance, resin composition and solvent composition. The photoresist compositions of the present invention have markedly better performance with respect to resolution capability, unexposed film thickness remaining after development, absorbance properties and visible transparency.

Japanese Patent 61/45420 A2 describes a photoresist composition containing a poly-DAQ PAC. The PAC, resin and solvent are different from those of the present invention. The performance properties of said composition, especially with respect to unexposed film thickness remaining after development, are inferior to that of this present invention.

Japanese Patent Application 8525660 (850213) describes a photoresist composition containing a PAC with a poly-DAQ PAC. The PAC, resin and solvent are quite different from those of the present invention.

Japanese Patent Application 84239330 (841115) describes a photoresist composition containing PACs, some of which contain a poly-DAQ PAC. The PAC, resin and solvent are of quite different composition from those of the present invention. In addition, the degree of PAC esterification claimed is less than the range of the present invention.

U.S. Pat. No. 4,555,469 describes a photoresist composition containing PACs, some of which may contain a poly-DAQ PAC. These PACs are esters of a novolac resin and are of a polymeric nature with structures different from those of the present invention. There are at most very minimal amounts of fully esterified PAC in the compositions of said patent, because the fully esterified novolac resin is minimally soluble in useful photoresist solvents. As shown in the present invention, the lack of fully esterified PACs lessens the resolution capability of photoresists based on such PACs. Also, the resin structure and solvent composition of said patent are different from those of the present invention.

The art of conventional positive photoresists is well known. For example, U.S. Pat. Nos. 4,550,069 and 4,529,682 describe the principles of positive photoresist compositions, including differential solubility, contrast, photospeed, resolution, unexposed film thickness loss and applications. These and other patents describe typical embodiments, including particular plasticising resins, dyes, anti-striation agents, adhesion promoters, and speed promoters.

With respect to the solvent component, an acceptable solvent must be capable of dissolving the required amounts of photosensitizer or PAC. Typically a photoresist formulation must contain between 2.5 and 5 percent by weight PAC in order to render the dried unexposed photoresist film sufficiently insoluble in an aqueous alkaline developing solution. A widely used casting solvent composition for positive photoresists consists of a mixture of ethylene glycol monoethyl ether acetate, n-butyl acetate, and xylene in the ratio of 80:10:10, as taught in U.S. Pat. No. 4,550,069.

The difficulty in dissolving PACs having multiple diazoquinone moieties with traditional solvents is a well known aspect of the prior art, as shown in European Patent 0,126,266 A2. Accordingly, in view of solubility limitations, it is common prior-art practice to use a mixture of sensitizers consisting of less soluble and more soluble types, or even to operate with the solution supersaturated relative to the less soluble sensitizer component. This practice can lead to precipitation of the sensitizer prior to or during use of the photoresist composition, and consequently can result in a short shelf life. There are several approaches to overcoming the solubility limitations. Among them are: (1) using a more soluble photosensitizer, (2) using a more effective solvent, and (3) using filtration of the composition immediately at the point of use. U.S. Pat. No. 4,266,001 discloses certain organic esters of diazonaphthoquinone sulfonyl chloride (i.e. oxodiazonaphthalene sulfonyl chloride) that are distinguished as having a high solubility in traditional photoresist solvents. Some of the prior-art photosensitizers consisting of certain esters of 1-oxo-2-diazonaphthalene-5-sulfonic acid are among the more soluble of PACs in traditional solvents, while many variations of these PACs, such as certain esters 1-oxo-2-diazonaphthalene-4-sulfonic acid are known to be less soluble, as discussed in B. Z. Yakovlev et al., Khim. Prom-st., 9, 564, 1981.

Traditional solvents used in the prior art include: ethyl cellosolve or ethylene glycol monoethyl ether, ethyl cellosolve acetate or ethylene glycol monoethyl ether acetate, methyl cellosolve or ethylene glycol monomethyl ether, methyl cellosolve acetate or ethylene glycol monomethyl ether acetate, N,N-dimethyl formamide, dioxane, and cyclohexanone, as shown in Japanese Patents 8286548 and 81202455. In order to improve coatability, up to 20 percent by weight of other solvents such as xylene, n-butyl acetate, and cyclohexane are included. Propylene glycol monoalkyl ethers are perceived by some people to be biologically safer solvents than the traditional ethylene glycol analogs (European Patent Application 85106774). Propylene glycol monoalkyl ether acetates are attributed to impart a photoresist photospeed advantage (U.S. Pat. No. 4,550,069). Also, solvent combinations, such as solvents with 60° to 170° C. boiling points admixed with solvents with 180° to 350° C. boiling points, are claimed to eliminate coating striations as described in Japanese Patent Application J60024545-A.

Other solvents or mixtures of solvents have been discussed in the art as providing photoresist compositions of exceptional stability to storage. The active solvent in many of these formulations consists of pure, or in part, cyclopentanone and cyclohexanone as shown in Japanese Patent Application 84/155838. Combinations of cyclopentanone and cyclohexanone with 5- to 12-carbon aliphatic alcohols also are attributed to have good coating performance, as described in European Patent Application 0,126,266. Mixtures of acetone, ethylene glycol, and water are reported to form highly stable photoresist solutions, as shown in German Offen. DE 2319159.

Nearly all of the solvents described above, as well as others in the prior art relating to photoresist compositions containing diazonaphthoquinonesulfonate or carboxylic acid esters of trihydroxybenzophenone, are limited in their applications. This is particularly the case when contemplated for industrial use where the combination of good solution stability, low toxicity, acceptable margin of safety against fires and explosions, and good coating characteristics is important. For example, methyl cellosolve acetate, N,N-dimethylformamide, and cyclohexanone have been implicated as biological threats to worker safety. In addition, structurally related alkylene glycol monoalkyl ethers and their acetates are potential biological threats to worker safety, as reported in the NIOSH Current Intelligence Bulletin 39, May 391983.

In order to provide an optimal margin of safety against fires and explosions, it is desirable for the photoresist composition to have as high a flash point as possible. This substantially restricts the use of highly volatile solvents such as acetone, cyclopentanone, and 1,4-dioxane, since these solvents have unacceptably low flash points. Since flash point generally correlates well with boiling point, the need for safety against fire and explosions places substantial restrictions on using solvents with boiling points below 110° C. in photoresist compositions.

In addition to safety issues, the use of highly volatile solvents presents severe coating problems as well. Since efficiently practicing the art of high resolution microlithography requires maintaining critical dimension control from wafer edge to wafer edge, it is essential for a photoresist coating to have an extremely high degree of thickness uniformity, typically less than 50 angstroms variation across a 100 mm diameter substrate. Solvent mixtures containing as little as 5 percent of solvents with boiling points below 110° C. tend to produce unacceptable thickness variation, because the drying time is likely to be too short compared to the spreading time in a typical spin coating process.

On the other hand, it is important for a photoresist solvent to be volatile enough to evaporate nearly completely during the coating process. This requirement places severe restrictions on the use of relatively high boiling solvents in photoresist compositions, especially since the post spin bake temperature cannot be raised much above 110° C. without causing substantial thermal decomposition of the photosensitizer.

Finally, the distinction between physical solution stability and chemical reactivity should be made. As discussed above, the literature has a number of examples of highly stable photoresists based on solvent mixtures containing cycloaliphatic ketones. Although these photoresists are highly stable in the sense that the photosensitizer does not precipitate out of solution, they are chemically unstable. The diazo moieties are reactive towards cycloaliphatic ketones. It is well known that the color of solutions of photosensitizer and cyclopentanone, for example, turns from red to black on standing at room temperature for just a few days. Opening sealed sample vials of such solutions is accompanied by audiable release of pressurized nitrogen gas, indicating that the photosensitizer has undergone decomposition. The same is true of many amines, even to a higher degree. It is essential for industrially viable photoresist compositions to be free of such degradation effects.

SUMMARY OF THE INVENTION

Typical objects of this invention are to provide:
1. A polyphotolysis photoresist process having the advantages of high resolution capability and high unexposed film thickness remaining after development,
2. A polyphotolysis photoresist composition having the advantages of high resolution capability and high unexposed film thickness remaining after development,
3. A group of compounds useful as improved solvents in resist compositions,
4. Several groups of phenolic resins useful in photoresist compositions,
5. New compounds useful for the synthesis of new photosensitive compounds, and
6. A group of improved photosensitive compounds useful as the PAC(s) in photoresist compositions.

Other objects, aspects and advantages of this invention will become apparent to those skilled in the art upon further study of this specification and appended claims.

The present invention provides an improved photoresist process and compositions which can yield increased contrast and resolution capability, plus yield improved unexposed film thickness remaining after development, reduced non-bleachable absorption in the near-UV actinic region, practical visible transparency and improved photoresist safety and stability. The compositions of the present invention utilize new improved resins and PACs combined with new solvents to provide requisite solvency power and safety characteristics.

DETAILED DESCRIPTION OF THE INVENTION

Figure 1:
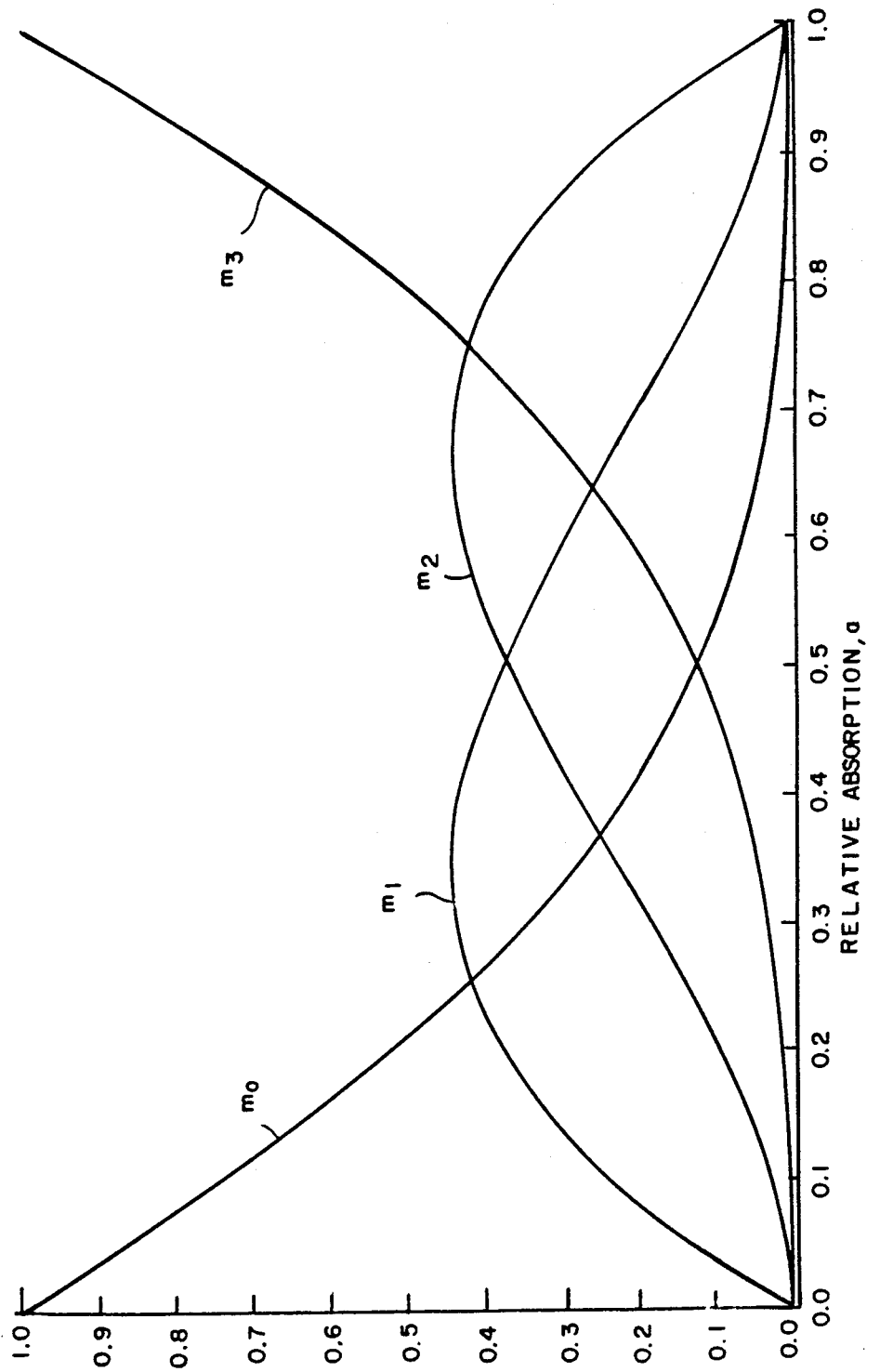
FIG. 1 is a graphical representation of the relative concentrations of certain photoproducts produced by irradiation of a polyesterified light sensitive compound as a function of relative adsorption.
Figure 2:
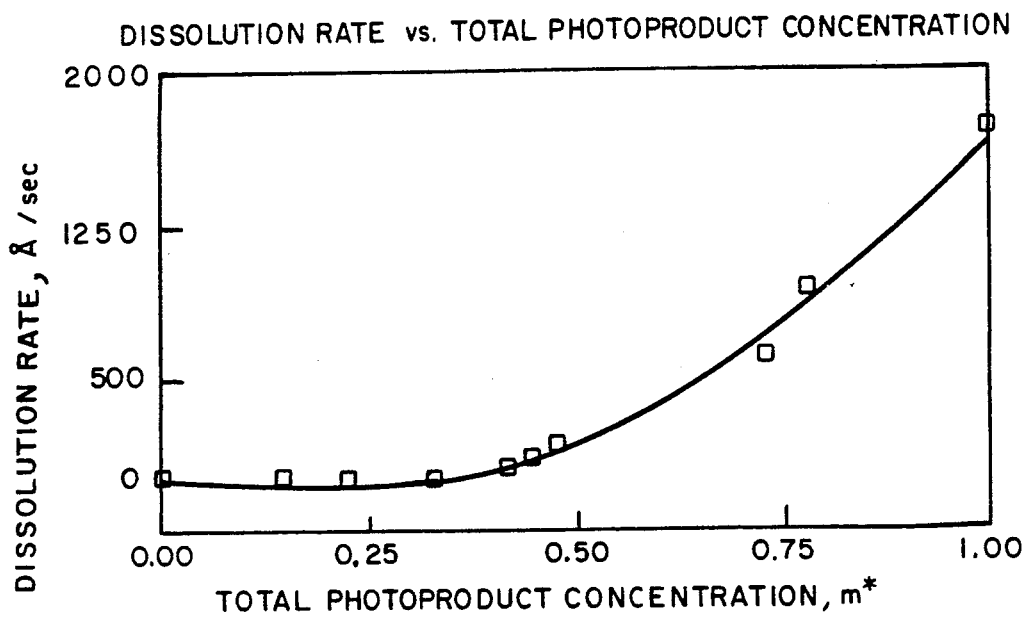
FIG. 2 is a graphical representation of the dissolution rate for a photoresist of the invention as a function of total photoproduct concentration.
Figure 3:
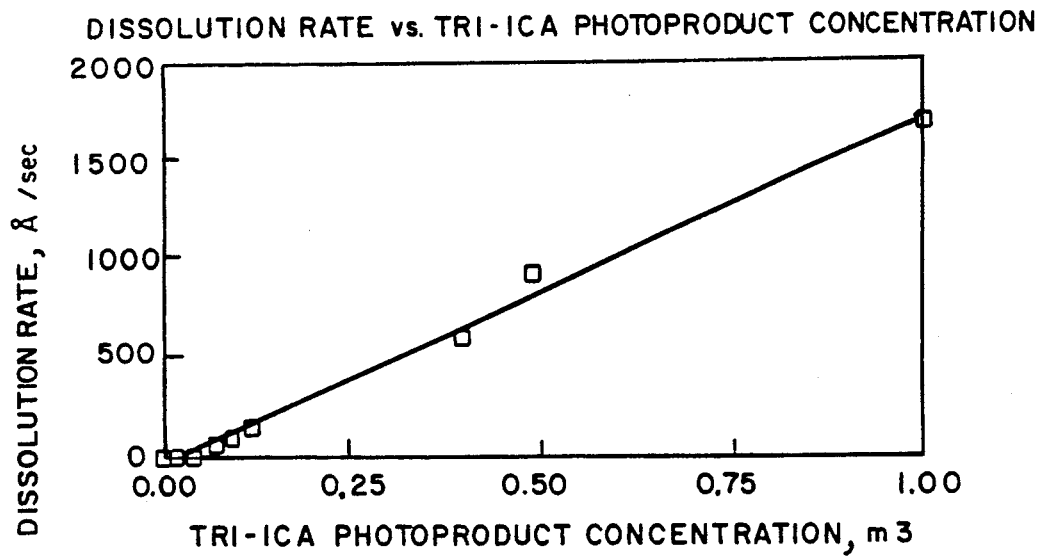
FIG. 3 is a graphical representation of the dissolution rate of a photoresist of the invention as a function of the concentration of tri-indene carboxylic acid ester concentration.

The present invention provides a novel photoresist process and compositions which contain new high resolution novolac resins, new high resolution PACs with several diazoquinone groups per molecule dissolved into new safer solvents with high solvency power. The compositions of the present invention have the advantages of high contrast and resolution capability, high unexposed film thickness remaining after development, low percent non-bleachable absorption, minimal visible absorption and increased photoresist stability and safety. The preferred compositions of the present invention offer increased resolution capability by adhering to the optimum characteristics of the heretofore unknown process of polyphotolysis.

The present invention relates generally to photoresist compositions with PACs which are sensitive to energetic radiation. The energetic radiation typically consists of ultraviolet light, although other forms of radiolysis, including x-rays, gamma-rays, synchrotron radiation, electron beams and particle beams also may be used.

For many purposes, the photoresist compositions of the present invention are commonly used in a positive printing mode. Techniques for using the compositions of the present invention in the negative mode are also well known to those skilled in the art, examples of which are described by E. Alling and C. Stauffer, *Proc SPIE*, Vol. 539, pp 194-218 (1985) and F. Coopmans and B. Roland, *Proc. SPIE*, Vol. 631, pp 34-39 (1986).

Photoresist compositions of the present invention are also useful in a multilayer printing process. For example, these compositions can be used as an imaging layer coated on top of a planarizing layer, for example, as described by A. W. McCullough et al., *Proc. SPIE*, Vol. 631, pp 316-320 (1986). These compositions can also be useful as a planarizing layer in a multilayer process, for example, as described by S. A. McDonald et al., *Proc. SPIE*, Vol. 631, pp 28-33 (1986).

The cresol novolac resins of the present invention are produced by condensing with formaldehyde a mixture of cresol isomers with the various cresol isomers present in proportions such that the cresol mixture consists essentially of less than 30 percent ortho-cresol, 25 to 46 percent meta-cresol and 24 to 75 percent para-cresol.

The most preferred cresol novolac resins of the present invention are produced by condensing formaldehyde with a mixture of cresol isomers, wherein the percentage values of the cresol isomers in the cresol mixture are given by the following two compositions: 1) less than 10 percent ortho-cresol, 40 to 46 percent meta-cresol and 44 to 60 percent para-cresol; and 2) 43 to 46 percent meta-cresol and 54 to 57 percent para-cresol.

These resins are prepared as described in Chapter 5 of *Phenolic Resins*, A. Knop and L. A. Pilato., Springer-Verlag, New York, 1985. After the resin is produced, it is characterized using solution viscosity measurements, differential scanning calorimetry, gel permeation chromatography and, in some examples, by combined gel permeation chromatography-low angle laser light scattering measurements as practiced in the art. The cresol-formaldehyde novolac resins useful in the present invention all have a glass transition temperature of 100° to 105° C. and weight-average molecular weight of 4,000 to 35,000 Daltons.

Another useful class of phenolic resins of the present invention is based on bishydroxymethylated phenolic compounds. A bishydroxymethylated phenolic compound such as 2,6-bis(hydroxymethyl)-p-cresol may be produced by reacting para-cresol with formaldehyde in the presence of a base. The bishydroxymethyl group of the compound is reactive and may in the presence of heat, acid or base react with itself or with other reactive compounds. If the other reactive compound is a phenolic material, such as phenol, cresol, dimethylphenol, trimethylphenol, naphthol, biphenol, phenylphenol, bis(hydroxyphenyl)methane, isopropylidenebiphenol, catechol, resorcinol, thiobiphenol and the like, which contain at least two sites in the aromatic ring(s) of sufficient reactivity to undergo facile Friedel-Crafts reactions, then the condensation reaction of the said reactive compound with a bishydroxymethylated phenolic compound can sustain polymerization and result in the formation of polymers. If the reactants are of good purity, then high-molecular-weight polymers can be made. To prepare polymers having utility in photoresist compositions, the bishydroxymethylated phenolic compound and the reactive phenolic compound are dissolved in an appropriate non-reactive or non-interfering solvent and an acid catalyst is added. When a volatile reactive phenolic compound is used in excess, it may also serve as a solvent or co-solvent. The condensation reaction leading to polymer formation can be carried out below ambient, at ambient or above ambient temperature. It is generally more practical to conduct the reaction at elevated temperature. A suitable acid catalyst may be a mineral acid such as hydrochloric acid, sulfuric acid, phosphoric acid, or an organic acid such as oxalic acid, maleic acid, formic acid, toluenesulfonic acid and the like. In certain cases, inorganic catalysts may also be used. These may include compounds of Zn, Mn, Mg, Al, Ti, Cu, Ni and Co. Upon completion of the condensation reaction the solvent and unreacted reactive phenolic compound may be removed via volatilization under reduced pressure and elevated temperatures. Another method by which the polymer may be recovered from the reaction mixture is by precipitation of the polymer into a liquid which is a non-solvent for the polymer but a solvent for the reaction solvent, catalyst and unreacted reactants. If the precipitation approach is used, the polymer is dried at elevated temperatures under reduced pressure. The polymer produced in this manner has substantially an alternating copolymer structure.

The bishydroxymethylated phenolic compounds that are particularly useful in this invention are the reaction products of ortho-cresol, meta-cresol, para-cresol, 2-, 3- or 4-phenylphenol, 2,3-dimethylphenol, 3,4-dimethylphenol, 3,4,5-trimethylphenol, para-ethylphenol, para-propylphenol, para-butylphenol, para-nonylphenol, bromophenols, fluorophenols, chlorophenols, trimethylsilylphenol, chloromethylphenols, acylphenols, para-hydroxybenzoic acid, para-nitrophenol and the like with formaldehyde in the presence of base. A suitable base which will promote the reaction is sodium or potassium hydroxide.

The substantially alternating copolymer produced by the acid catalysed condensation reaction of a bishydroxymethylated phenolic compound and a reactive phenolic compound can be further reacted in the presence of acid with formaldehyde and the same or different reactive phenolic compound. The resin that results is substantially a block copolymer.

Another useful class of phenolic resins of the present invention is based on aromatic aldehydes. Aromatic aldehydes, compared to formaldehydes, are less reactive toward condensation reactions leading to polymerization. However, under more vigorous reaction conditions, aromatic aldehydes such as benzaldehyde, substituted benzaldehydes, naphthaldehyde and substituted naphthaldehydes can condense with a reactive phenolic compound such as meta-cresol in the presence of a strong acid catalyst such as sulfuric acid and toluenesulfonic acid to produce polymers. Generally the polymers that are produced, however, have low molecular weights, poor physical, mechanical and lithographic properties. We have discovered that, by using catalytic amounts of ionizable compounds of divalent sulfur such as sulfur dichloride, sodium thiosulfate, hydrogen sulfide, sodium sulfide, thiols, thiophenols, thioacetic acid, thioglycollic acid, mercapto alkyl sulfonic acid or hydroxyalkylthiols in conjunction with a strong acid catalyst, the condensation of aromatic aldehyde with a reactive phenolic compound results in the formation of polymers that have higher molecular weights and, therefore, are more suitable as resins for resists. The aromatic-aldehyde-based resins are very useful as resist resins since many of them provide resist formulations that have high photospeed and thermal stability. Furthermore, the properties of these resins may be further modified by including in the condensation a bishydroxymethylated phenolic compound.

Two or more resins of similar or different compositions can be blended or combined together to give additional control of lithographic properties of photoresist compositions. For example, blends of resins can be used to adjust photospeed and thermal properties and to control dissolution behavior in developer.

Higher resolution patterning capability is required as the density of circuits in electronic devices increases; e.g., as the industry progresses from VLSI to ultra large scale integration (ULSI) of circuit devices. Economical enhanced resolution patterning capability is offered by higher resolution photolithography. This generally requires higher resolution and higher contrast resist materials, which can tolerate a greater extent of degradation of the light aerial image caused by diffraction phenomena as feature size decreases. Increased resist contrast generally is a measure of increased resolution capabilities.

Positive photoresists containing DAQ sulfonic and carboxylic acid esters and amides as the PAC(s) in a novolac polymer matrix are high resolution materials which do not swell during development and possess good dry-etch resistance. Typically, a suitable hydroxy-functional or amino-functional ballast compound, molecule or group is esterified with the DAQ group to give a base-insoluble ester or amide PAC which greatly reduces the dissolution rate of the admixed base-soluble resin in an aqueous alkaline developer. Other substituent groups can be bonded to the ballast molecule to modify the solubility properties of the PAC. Acidic hydrophilic substituent groups such as acid and hydroxyl, or other hydrophilic groups such as polyethylene oxide groups, enhance the solubility of the PAC molecule in aqueous solutions. Hydrophobic substituent groups such as hydrocarbons, aryl halide, alkyl esters and aryl halide groups diminish the solubility of the PAC molecule in aqueous solutions. Upon photolysis in the presence of water, such as upon the irradiation of thin films under normal conditions, the DAQ groups undergo a sequence of reactions to ultimately form indene carboxylic acid (ICA) groups, which make the photolyzed PAC basesoluble. Thus, the irradiated regions of the photoresist film become soluble in the alkaline developer. The photochemistries of DAQ groups linked to the ballast molecule through carboxyl ester, sulphonate ester, carbonamide or sulfonamide linkages are essentially equivalent in terms of the photochemical and subsequent reactions which cause the PAC to become base-soluble. [Normal conditions are normal ambient temperature and humidity such as about 16° to 25° C. (61° to 77° F.) and about 25 to 75 percent relative humidity.] If two or more DAQ groups are bonded to the same ballast group to form a multi-DAQ PAC, the DAQ groups undergo essentially independent sequential photolysis with increasing dose to ultimately form a multi-ICA product (see Diagram 1.)

Contrast is primarily controlled by the rate of change of photoresist dissolution rate (and hence ultimately film thickness) with dose. A method for producing at least one element of a threshhold-like response into the initial phase of the photoresist development process, well known to those familiar with the art, is to introduce surface inhibition to development by adding various strong surfactants into the aqueous alkaline developer solutions.

In the present invention, we describe a novel process and compositions for highly enhancing the resolution capability of resists which provide improved control of the photoresist dissolution throughout development. The process is distinctively different from surface inhibition to development and does not rely on surfactant additives in the developer solutions. The process is called "polyphotolysis" and is based on a heretofore unrecognized principle involving radiolysis or photolysis of resist compositions containing multifunctional PAC(s) and high developer selectivity to certain PAC photoproducts or radiolysis products. In particular, the process involves the conversion, upon photolysis combined with any other types of chemical reactions, of some of the photoactive substituent groups of the PAC from hydrophobic to acidic hydrophilic groups, such as acid- and hydroxy-functional groups. Depending upon the photoresist composition and patterning requirements, conversion of 15 to 100 percent of the photoactive substituents of the PAC(s) from hydrophobic to acidic hydrophilic usually yields acceptable results. It is generally more preferred to convert 35 to 100 percent of the photoactive substituents. The process will be described here in detail for the specific example of a tri-DAQ PAC, Q, in Diagram 1.

The DAQ group of the PAC is highly absorbant in the wavelength region of 350–440 nm. This absorbed light, in effect, converts DAQ to ICA photoproduct. ICA photoproduct is practically non-absorbant in the region of 350–440 nm, because we use a minimally absorbant ballast group. The absorbance properties and photolysis of individual DAQ groups chemically bonded to this ballast group are essentially independent of degree or location of substitution and obey Beer's law. Thus, the relative extinction coefficients (and cross-sections) of materials, 0, 1, 2 and 3 in Diagram 1 are 3,2,1 and about 0.1 or less, respectively. The change in concentrations $m_0$ to $m_3$ of the respective materials 0 to 3 with dose E are consequently expressed by Equations 1 through 4:

$$dm_0/dE = -3m_0\sigma \qquad (1)$$

$$dm_1/dE = (3m_0 - 2m_1)\sigma \qquad (2)$$

$$dm_2/dE = (2m_1 - m_2)\sigma \qquad (3)$$

$$dm_3/dE = m_2\sigma, \qquad (4)$$

where $\sigma$ is the cross-section for the photoreaction of Diagram 1a.

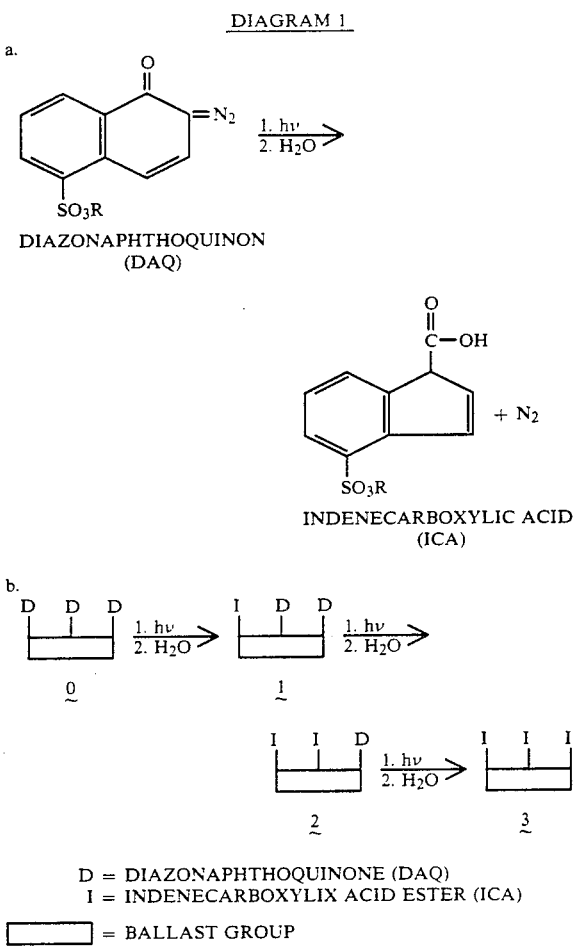

DIAGRAM 1

D = DIAZONAPHTHOQUINONE (DAQ)
I = INDENECARBOXYLIX ACID ESTER (ICA)
☐ = BALLAST GROUP

Diagram 1: a. Photoreaction and subsequent hydrolysis
(ambient moisture) of diazoquinone group.
b. Sequential photoreaction of a tri-DAQ
photoresist dissolution inhibitor.

Since the DAQ groups are the only ones that absorb appreciably, and since they react independently, it can be shown by mathematics and the well known Beer's Law and an equation of the form of Eq. (1), that $$\sigma E = \ln(A^\circ/A). \tag{5}$$

$A^\circ$ is the initial absorbance of any mixture of materials $\underline{0}$, $\underline{1}$, $\underline{2}$ and $\underline{3}$, and A is the absorbance after dose E', where E' is related to dose E by:

$$E' = \sigma E. \tag{6}$$

Thus, the relative dose, E', to which the sample of photoresist has been subjected can be determined from the degree of bleaching $$a = A/A^\circ = e^{-E'}. \tag{7}$$

With this notation, the solution of Equations (1) to (4), when the initial concentrations at zero dose are denoted by the superscript $^0$, are $$m_0 = m_0^0 a^3 \tag{8}$$

$$m_1 = [3m_0^0(1-a) + m_1^0]a^2 \tag{9}$$

$$m_2 = [3m_0^0(1-a)^2 + 2m_1^0(1-a) + m_2^0]a \tag{10}$$

$$m_3 = m_0^0(1-a)^3 + m_1^0(1-a)^2 + m_2^0(1-a) + m_3^0 \tag{11}$$

Following the pattern of this solution, the general solution for the case of a resist with a single type of PAC with q DAQ groups per PAC molecule is $$m_i = m_0^0 {}_i^q C(1-a)^i a^{q-i}, \tag{12}$$

where ${}_i^q C$ is the combinatorial nomenclature denoting the number of ways of choosing a combination of i units from a set of q units. The concentrations of the products from a tri-DAQ PAC as a function of absorbance ratio, a, or of relative dose, E', via. Eq. (7), are $$m_0 = m_0^0 a^3 \tag{13}$$

$$m_1 = 3m_0^0 a^2(1-a) \tag{14}$$

$$m_2 = 3m_0^0 a(1-a)^2 \tag{15}$$

$$m_a = m_0^0(1-a)^3 \tag{16}$$

and are shown graphically in FIG. 1.

A more complicated set of equations, similar to Equations 1 through 4, may be used to treat the case of PAC which initially consists of a mixture of individual components in which both DAQ and hydrophilic groups such as hydroxyl or ICA are bonded to the same ballast molecule. The mathematical expressions of Equations 1 through 4 also apply to the most general case where radiolysis converts the PAC in a series of radiation-sensitive reactions from hydrophobic to hydrophilic, or vice-versa.

As shown by D. J. Kim, W. G. Oldham, and A. R. Neureuther in *I.E.E.E. Transactions on Electron Devices*, Vol. ED-31 No. 12 p. 1730, Dec. 1984, present models of photoresist development processes express dissolution rate r in terms of concentration m* of a single photoproduct:

$$r = f(m^*, r_0, r^*), \tag{17}$$

where r* is the dissolution rate of the mixture of resin and the fully photolyzed PAC, and $r_0$ is the corresponding rate for the mixture of resin and unphotolyzed PAC. The single photoproduct concentration m*, which is identical to the total photoproduct concentration, is related to the relative absorption, a, by $m^* = 1 - a$.

Recognizing the polyphotolysis mechanism, rate r is appropriately expressed as a function of concentrations $m_0 - m_2$ (note that $m_3 = 1 - m_0 - m_1 - m_2$) and primary dissolution rates $r_0 - r_3$;

$$r = f(m_0, m_1, m_2, r_0, r_1, r_2, r_3) \tag{18}$$

The exact nature of this mixing law, f, does not affect the general concepts presented below. For the purpose of this invention, the conventional "rule of mixtures" will be used and evidence in support of it is presented in Example 119 for a particular example of a tri-DAQ PAC-based photoresist system.

The rule of mixtures is $$f = \sum_{i=0}^{q} (m_i r_i). \tag{19}$$

The beneficial high contrast is the result of higher dissolution rates for the higher indices i, as shown in the following example. In this example of a tri-DAQ PAC, the best contrast will occur when $r_0 = r_1 = r_2 = 0$ and, $r_3 >> 0$. This is the ideal case. Other such cases, while not ideal, can also offer higher contrast. An example is a hexaester PAC with $r_6 \cong r_5 \cong r_4$, $R_3 << r_4$, $R_2 << r_4$, $r_1 << r_4$, and $r_0 << r_4$.

Contrast is the rate of decrease of developed normalized film thickness with respect to the logarithm to base ten of the exposure energy at, or closely approaching, the exposure energy for which the entire film is lost. Mathematically the definition of contrast is:

$$\gamma = -\left[\frac{d\hat{h}}{d(\log_{10}E)}\right]_{E_0, t_d} \quad (20)$$

where h is the normalized film thickness $h/h_0$ after exposure to energy E and development for time $t_d$, and the photospeed, $E_0$, is the minimum value of E for which $h=0$ (complete development).

For the case of a single type of pure PAC with q photoactive groups per molecule, and where dissolution is essentially controlled by the fully photolysed PAC, the photoresist dissolution rate according to Eq. 12 and 19 is $$r = r_q m_0^0 (1 - e^{-E\sigma})^q. \quad (21)$$

From Equations 20 and 21, it can be shown that $$\gamma = \frac{2 \cdot 303 \, q\sigma E_0 \, e^{-\sigma E_0}}{(1 - e^{-\sigma E_0})}. \quad (22)$$

Since the cross section $\sigma$ is constant (for a given spectral distribution of the exposure light), it is to be expected that the contrast can be improved in direct proportion to the number q of photoactive groups per PAC molecule while maintaining the required photospeed.

Therefore, high contrast can be obtained by having a distribution of $r_i$ values that is strongly skewed towards high $r_i$ at high i. To achieve this in practice, it is necessary to have not only an appropriate PAC molecule but also an appropriate combination of particular developers, resins and other appropriate material components. That is, the favorable distributions of r depend on the photoresist system, not just on the PAC molecule alone.

Another requirement of the resin and the developers is to maintain the required $E_0$. The following expression for relative photospeed can be derived from Equation 21 in the ideal case where $r_q >> r_k$, $k < q$.

$$E_0' = \ln\left[\frac{1}{1 - \frac{h_0}{t_d r_q m_0^0}}\right]^{1/q}$$

This equation shows that if q is increased, $r_q m_0^0$ must also be increased to maintain the desired photospeed at fixed development time. Physically this means that either the inherent dissolution rate of the resin and/or the strength of the developer must be increased. Since these quantities may also affect the distribution of $r_i$, it is again made clear that the system as a whole must be considered in judging its likelihood for good performance.

Developer strength can be varied, for example, by altering the concentration of alkaline species dissolved in the aqueous solution. For the specific case of aqueous tetraalkylammonium hydroxide developers, such as aqueous tetramethylammonium hydroxide, the optimum concentration range appears to be between 0.12 M and 0.60 M. At higher developer concentrations, the distribution of $r_i$'s are adversely effected, leading to decreased resolution capabilities and decreased unexposed film thickness remaining after development. At lower developer concentrations, photospeed becomes unacceptably large and bath life is more rapidly diminished due to depletion of hydroxide ions.

In summary, contrast, which generally is a measure of resolution, can be improved in direct proportion to the number of photoactive sites per molecule of PAC if appropriate developers and resins are combined.

Absorption properties of the photoresist composition are important. For high contrast and resolution, it is important that a photoresist have minimum non-bleachable absorption. A distinction is made here between the absorption of light that contributes to the conversion of photoactive groups (e.g. DAQ to ICA) and that which does not. The former serves a useful purpose, is unavoidable and is called "bleachable" absorption, because such absorption diminishes as the DAQ becomes converted to ICA. The spectrum of wavelengths over which useful bleachable absorption takes place is known as the actinic range. Bleachable absorption that does not contribute to useful conversion of DAQ to ICA, or other enhancement of dissolution rate, adversely effects resolution unless it can be highly concentrated on the directly exposed surface of the resist film.

In the prior art, it has been common for photoresists to contain molecular groups that absorb light, even in the actinic range, without undergoing any useful bleaching or photolysis. This is nonbleachable absorption, and the manner in which it reduces contrast and resolution can be mathematically modeled in several ways with various degrees of accuracy. A simple qualitative explanation is as follows.

Absorption progressively weakens light as it penetrates a film of photoresist. The local exposure at great depths is much less than the incident exposure at the surface. Local exposure very near the surface is almost unaffected by absorption. Where the incident exposure is weak, subsequent dissolution will always be shallow and the presence or absence of absorption has only a weak effect on film thickness removed by development. Where the incident exposure is large, the potential depth to which the film would dissolve in the absence of absorption is large so that absorption has a strong effect. Since the film thicknesses removed by development in strongly and weakly exposed areas become more nearly equal with increasing unbleachable absorption, the effect of the presence of unbleachable absorption is to reduce contrast.

Absorption within the visible range of 450 to 650nm is also undesirable. In microphotolithographic patterning processes, it is necessary to position the new image on the wafer with great accuracy relative to a pattern that has been made on the wafer in a preceding process cycle. This positioning, or alignment, is usually done optically by means of light in the visible region of spectrum. Since the entire wafer is coated with a photoresist film, it is important that little light be absorbed in this visible part of the spectrum during its double passage through the film. Only when the resist film has minimum absorption can the visible light be used to make the alignment in the minimum time. A short alignment time is very desirable, especially when exposure is done by a step-and-repeat method.

Photoresist absorption may be summarized as follows. In order to maximize contrast, which generally is a measure of enhanced resolution, it is desirable to minimize the non-bleachable absorption of the photoresist.

Absorption in the visible region generally is undesirable as it interferes with optical mask alignment techniques.

Another important performance characteristic of a photoresist system is the "unexposed film thickness remaining after development." Typically, some photoresist film is lost during development in areas of a patterned wafer that are masked. Such areas are often only about 0.1 millimeter or less in size. Because of stray light in the optical system and diffraction effects in printing small features, the masked regions of resist often receive an exposure which is very small but not quite zero. This slight dose of light, together with a small, but significant, rate of dissolution for unexposed resist can lead to a significant decrease in film thickness in said masked regions.

If a photoresist system has a high contrast and a photospeed that is not very small, it is a logical consequence of the definitions of these two properties that the system will also have a small film thickness removed after development. Alternatively, from the description of the polyphotolysis process given above, it is clear that the basis for achieving high resolution is to have low dissolution rates for mixtures of resin and lightly photolysed PACs. These low dissolution rates ($r_0, r_1$ etc.) translate to a low film thickness loss after development. It will be shown later in the Examples that high contrast systems using the process of polyphotolysis are found to have small, desirable values of film thickness removed after development. In particular, these preferred systems have at least 44 percent by weight of the PAC molecules with no acidic hydrophilic groups, and in the more preferred cases, greater than 54 percent by weight. Photoresist systems with only 34.5 percent by weight of the PAC molecules with no acidic hydrophilic groups performed poorly with respect to unexposed film thickness remaining after development and resolution and contrast.

In practice, the advantage of a small film thickness removed after development is that the full capability for etch resistance is maintained in the unexposed areas. This is particularly valuable when existing tall structures have to be covered by the resist. The high corners of such structures tend to project close to the surface of the as-spun film. Any unexposed film thickness lost during development would bring them even closer, thus presenting increased danger of the corner breaking through the resist at some point in the etch process.

In modern applications, any resist system that has a film thickness remaining after development in masked regions that is less than 96 percent of the original thickness is undesirable.

The solvents of the present invention offer several new advantages, including: (1) better photosensitivity (2) lower toxicity, (3) an equivalent cast film thickness from lower percent solids formulations than with traditional solvents, and (4) better solvency and solution stability.

The importance of photosensitivity is well documented in the literature. Materials showing higher photosensitivities allow the photolithography process to have a higher throughput in terms of wafers exposed per hour. This translates into economic advantages of lower cost devices.

Without question, toxicity is an important issue in the workplace, especially since the traditional photoresist solvent, ethylene glycol monoethyl ether acetate, and related compounds such as ethylene glycol monomethyl ether acetate, have been found to be teratogenic (NIOSH Current Intelligence Bulletin 39, May 1983).

Photoresist compositions made with some of the solvents of this invention, have the property that, for a fixed percent solids, they give thicker films than compositions based on the traditional solvents. This effect translates into an economic advantage in that less of the expensive solid materials are required to produce a given coating thickness than with compositions made with traditional solvents.

The solvency power of a solvent or solvent mixture useful in positive photoresist compositions according to this invention can be exemplified in terms of solubility parameters, $\delta$. The development of the solubility parameter concept is related closely to developments in the theory of dissolution of organic compounds and polymers, or more specifically non-electrolytes. (See H. Burrell, "Solubility Parameter Values," in *Polymer Handbook*, 2nd Edn., J. Brandup and I. H. Immergut, Eds., John Wiley, 1975.) The dissolution of a material is governed by the well known free energy equation:

$$\Delta G = \Delta H - T\Delta S$$

where $\Delta G$ is the Gibb's free energy change, $\Delta H$ is the heat of mixing, T is the absolute temperature, and $\Delta S$ is the entropy of mixing. A decrease in free energy, or negative $\Delta G$, implies that the dissolution will tend to occur spontaneously.

Since the dissolution process is always associated with a positive change in entropy, the magnitude of the $\Delta H$ is the deciding factor in determining the sign of the free energy change. Hildebrand and Scott proposed that $$\Delta H_m = V_m \left[ \left( \frac{\Delta E_1}{V_1} \right)^{\frac{1}{2}} - \left( \frac{\Delta E_2}{V_2} \right)^{\frac{1}{2}} \right]^2 \phi_1 \phi_2$$

where $\Delta H_m$ is the overall heat of mixing; $V_m$ is the total volume of the mixture; $\Delta E$ is the energy of vaporization of the respective component 1 or 2; V is the molar volume of component 1 or 2; $\phi$ is the volume fraction of the designated component 1 or 2 in the mixture. (See J. Hildebrand and R. Scott, *The Solubility of Non-Electrolytes*, 3rd Edn., Reinhold, N.Y., 1949.) The quantity $(\Delta E/V)$ has been variously described as the "cohesive energy density," or $\delta^2$.

A number of workers, including C. M. Hansen, have extended the single component solubility parameter concept of Hildebrand by taking into account the various intermolecular attractions that give rise to $\delta^2$. (See C. M. Hansen, *The Three Dimensional Solubility Parameter and Solvent Diffusion Coefficient*, Danish Technical Press, Copenhagen, 1967.) These attractions are mainly due to dispersion forces, dipolar forces, and hydrogen bonds. Thus $\delta^2$ can be written as:

$$\delta^2 = \delta^2_d + \delta^2_p + \delta^2_h.$$

The parameters themselves are computed by a number of methods, from equations of state, boiling points, densities, critical properties, etc. For purposes of this invention, it is appropriate to employ parameters determined after K. L. Hoy. (See K. L. Hoy, *Tables of Solubility Parameters*, Union Carbide Corporation Solvents and Coatings Materials Research and Development Department, Bound Brook, N.J., 1985.) The aggregate solubility parameter for a mixture, often referred to as simply the solubility parameter of the mixture, is the volume-fraction weighted-average of that solubility parameter for the components of the mixture.

In practice, these parameters are typically utilized in the form of a two dimensional plot of, for example, $\delta_p$ versus $\delta_h$. This surface contains a locus of points which define a characteristic region of solubility for a specific organic compound or polymer. Furthermore, any solvent or solvent mixture with solubility parameters $\delta_p$ and $\delta_h$ that fall within this region, will solubilize that particular organic compound or polymer. (See, for example, A. F. M. Barton, *CRC Handbook of Solubility Parameters and Other Cohesion Parameters*, CRC Press, Boca Raton, Florida, 1983.)

Typically the locus of points is empirically mapped out by conducting solubility tests of an organic compound with various solvents or solvent mixtures having known solubility parameters.

We have empirically determined a locus of points in solubility-parameter space corresponding to regions of solubility of various multi-DAQ PACs and mixed mono-, di-, and tri-DAQ PACs. These PACs have oxodiazonaphthalene photoactive substituents bonded to various functional ballast groups through intervening linkages. The solvents and solvent mixtures utilized have broad ranges of solubility parameters or aggregate solubility parameters $\delta_d$, $\delta_p$ and $\delta_h$. For PACs based on similar types, relative amounts and dispositions of functional ballast groups and oxodiazonaphthalene substituent groups, the solubilities of the PACs with carbonyl- and sulfonate ester and carbon- and sulfonamide intervening linkages are substantially the same. Instead of a cylindrical region of solubility-parameter space, as is typical of polymers, we have found that the region of solubility for the PACs corresponds more closely to the volume of solubility space defined by:

$\delta_d > 4.4$, $\delta_p > 3.6$, $\delta_h > 3.0$ and $\delta_p/\delta_h > 0.59$.

where $\delta_d$, $\delta_p$, and $\delta_h$ are in units of $(cal/cm^3)^{0.5}$.

A solvent or mixture of solvents with solubility parameters in the above indicated region would not be wholly adequate as a practical photoresist solvent if it also possessed one or more of the following detrimental characteristics: 1) toxicity, 2) low margin of safety due to too low flash point, 3) poor coating characteristics, 4) insufficient volatility and dryability; and 5) reactivity towards PACs.

Therefore, in view of these factors, acceptable materials should:
  i. have boiling point between 110° C. and 180° C.,
  ii. consist of C, H and one or more of the elements: Cl, F, O,
  iii. exclude cycloaliphatic ketones,
  iv. exclude alkylene glycol monoalkyl ether acetates and related derivatives such as ethylene glycol monomethyl ether acetate.

Because the biological activity of solvents within the region of this invention generally increases with increasing solubility parameters, the solvents of this last class generally offer the combination of high solvency and lower biological activity.

From group constants, the dispersive, polar, and hydrogen bonding components of the solubility parameter of alkali-soluble phenolic resins are estimated to be 8.6, 5.7, and 3.7, respectively. (See K. L. Hoy, *Tables of Solubility Parameters*, Union Carbide Corporation Solvents and Coatings Materials Research and Development Department, Bound Brook, N.J., 1985.) Since these solubility parameters are within the preferred region of PAC solvency, combinations of solvents with such resins, as in liquid photoresist compositions, generally will only change the overall solubility parameters towards improved solvency and solution stability.

Typical solvents useful in this invention are anisole, ethyl lactate, methyl lactate, ethyl-2-ethoxy acetate, methyl-2-methoxy acetate, methyl-3-methoxy propionate, ethyl-3-methoxy propionate, pyruvic aldehyde dimethylacetal, acetol, ethyl 2-ethoxy-2-hydroxyacetate, ethyl -2-hydroxyisobutyrate, amyl acetate, hexyl acetate, and methylacto acetate.

The following specific examples provide detailed illustrations of the methods of conducting the processes and producing and using the compositions of the present invention. These examples are not intended, however, to limit or restrict the scope of the invention in any way, and should not be construed as providing conditions, parameters or values which must be utilized exclusively in order to practice the present invention.

EXAMPLE 1

Novolac Resin from m-, p-, and o-Cresols

A 2-L four-neck resin kettle equipped with a stirrer, heating source, thermometer, variable reflux ratio distilling head and a nitrogen inlet tube was charged with 278.3 g (99 percent pure) m-cresol, 335.5 g (99 percent pure) p-cresol, 34.3 g (99 percent pure) o-cresol, 68.3 g of 36.9 percent formalin, 20 ml of deionized water and 12.0 g of oxalic acid dihydrate. The mixture was heated to about 60° C. at which point an exothermic condensation reaction ensued. When the reaction mixture temperature reached about 100° C., 273.3 g of 36.9 percent formalin was added in about 30 minutes. The reaction was then allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 516 g of novolac resin having a glass transition temperature, Tg, of about 100° C. was obtained.

EXAMPLE 2

A Resin Formed from meta-Cresol and 2,6-Bis(hydroxymethyl)-p-cresol

A mixture of 129.8 g m-cresol, 134.5 g 2,6-bis(hydroxymethyl)-p-cresol, 20 ml deionized water, 5.0 g oxalic acid dihydrate and 50 ml ethyl cellosolve acetate were reacted essentially as described in Example 1 but without the use of formaldehyde. About 217 g of resin having a number-average molecular weight, Mn, of 1640 Daltons and a Tg of 106° C. was obtained.

EXAMPLE 3

Novolac Resin from m-Cresol and 2,6-Bis(hydroxymethyl)-p-cresol

A phenolic resin rich in alternating phenolic copolymer block segments was formed by reacting a mixture of 519.0g of 99 percent pure m-cresol, 538.2 g 97 percent pure 2,6-bis(hydroxymethyl)-p-cresol and 20 g oxalic acid dihydrate in a solvent mixture of 40 ml deionized water and 200 ml ethyl cellosolve acetate. The reaction mixture was heated to about 70° C. to initiate the reaction forming the copolymer block segments. At 102° C., 32.6 g of 36.9 percent formaldehyde was added in 8 minutes to the reaction mixture to form substantially m-cresol formaldehyde block segments and to chemically bond these segments to the previously formed copolymer blocks. After heating the mixture at reflux for three hours, the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of product having a Tg of 112° C. was obtained.

EXAMPLE 4

A Resin Formed from m-Cresol, 2,6-Bis(hydroxymethyl)-p-cresol and 1-Naphthol A mixture comprising of 72.1g 1-naphthol, 84.1 g 2,6-bis(hydroxymethyl)-p-cresol, 5.0 g oxalic acid dihydrate and 150 ml ethyl cellosolve acetate in a 0.5-L resin kettle, equipped as in Example 1, was heated to initiate the condensation reaction substantially forming the 1-naphthol-methylene-p-cresol block segments. An exothermic reaction resulted, reaching a peak temperature of about 120° C. The reaction mixture was allowed to reflux for about 2 hours, 108.1 g m-cresol and 48.8 g of 36.9 percent formaldehyde were added, and the condensation mixture again allowed to reflux for about 2 hours. The volatiles present in the reaction mixture were removed by distillation and stripping as described in Example 1. About 201 g of resin having a Tg of about 121° C. and a Mn of 1940 Daltons was obtained.

Table I defines the substantially block copolymers and their properties. Example 4 is repeated with other polyfunctional monomers substituted for the 1-naphthol to form additional copolymers.

TABLE I

| Example | Mole Percent Reactants | Mn | Tg.°C. |
|---|---|---|---|
| 5 | 50 A, 25 B, 25 C | 1780 | 127 |
| 6 | 70 A, 15 B, 15 D | 1680 | 99 |
| 7 | 70 A, 15 B, 15 E | 1210 | 86 |

A is m-cresol, B is 2,6-bis(hydroxymethyl)-p-cresol, C is 4,4'-biphenol, D is 4,4'-isopropylenediphenol and E is 4,4'-thiodiphenol.

EXAMPLE 8

A Resin from 1-Naphthol and 2,6-Bis(hydroxymethyl)-p-cresol

A 500-ml 3-neck round bottom flask equipped with a stirrer, reflux condenser, thermometer, a gas inlet tube and an acid trap was charged with 21.6 g 1-naphthol, 25.2 g 2,6-bis(hydroxymethyl)-p-cresol and 200 ml 1,4-dioxane. The mixture was heated to about 60° C. to dissolve the bishydroxymethylcresol. The warm solution was saturated with anhydrous hydrochloric acid and allowed to stand at ambient temperature for about 22 hours. The reaction mixture was then heated to about 70° C. to expel most of the dissolved hydrochloric acid. After it was allowed to cool, the solution was slowly added to about 3 L deionized water to precipitate the product. The precipitate was collected, partially dried and re-precipitated from acetone into water. The resin was dried under about 125 mm Hg vacuum at 60° to 70° C. About 40.4 g of product having a Mn of about 1530 was obtained.

EXAMPLE 9

A m-Cresol-Salicylaldehyde Resin

A mixture of 183.2 g salicylaldehyde, 162.2 g m-cresol, 5.0g 3-mercaptopropionic acid, 1.5 g of a 50 percent aqueous solution of p-toluenesulfonic acid and 200 ml glacial acetic acid were charged into a 1-L reaction vessel equipped with a paddle stirrer, reflux condenser and a nitrogen inlet tube. The mixture was heated to reflux and maintained at reflux for 16 hours. The reaction mixture was slowly poured into 7 L deionized water to precipitate the resin. Once the solvent had exchanged with water, the product was collected on a filter, slurried once in warm deionized water for about 30 minutes, again collected, rinsed with water and dried in a vacuum oven under about 125 mm Hg and at about 100° to 105° C. About 286 g of a brown powder suitable as a binder in resist compositions was obtained.

EXAMPLE 10

A meta-Cresol, Salicylaldehyde and 2,6-Bis(hydroxymethyl)-p-cresol resin

A mixture of 146.0 g m-cresol, 146.5 g salicylaldehyde, 25.2 g 2,6-bis(hydroxymethyl)-p-cresol, 5.0 g 3-mercaptopropionic acid and 1.5 g p-toluenesulfonic acid monohydrate in 200 ml glacial acetic acid was reacted as described in Example 9 and about 281 g of resin was obtained.

Photoresist compositions were prepared as described in Examples 142 through 146. These compositions were evaluated according to the procedure described in Example 120.

EXAMPLE 11

Alpha,alpha'-bis-(2,3,4-trihydroxyphenyl)-1,4-diisopropylbenzene was prepared by the following two methods A. 101.5 g pyrogallol, 19.2 g alpha,alpha'-dihydroxy-p-diisopropylbenzene and 150 ml ethanol were placed in a 500-ml flask. Upon dissolution of the solids, 2.0 g p-toluenesulfonic acid monohydrate was added, the mixture was warmed to about 59° C. to 69° C. and kept at this temperature for about 21 hours. The reaction mixture was slowly added to 2 L of deionized water, the precipitate was collected on a filter and slurried twice in 1.8 L of water. The precipitate was vacuum dried at 60° C. to yield about 33.5 g of a product mixture containing at least 90 percent of alpha, alpha'-bis-(2,3,4-trihydroxyphenyl)-1,4-diisopropylbenzene as determined by high pressure liquid chromatography.

B. 201.8 g Pyrogallol, 31.6 g p-diisopropenylbenzene and 300 ml ethanol were added to a flask and stirred at 23° C. until the pyrogallol dissolved. 4.0 g of p-toluenesulfonic acid monohydrate was added, and the mixture was stirred at ambient temperature for 24 hours. The product was precipitated in 4 L deionized water, washed with copious amounts of water, and vacuum dried at 60° C. About 73.5 g of a product mixture was obtained containing at least 90 percent of alpha,alpha'-bis-(2,3,4-trihydroxyphenyl)-1,4-diisopropylbenzene. Similar results were obtained when HCl was used as a catalyst.

EXAMPLE 12

Alpha,alpha'-bis-(2,3,4-trihydroxyphenyl)-1,3-diisopropylbenzene 100.9 g Pyrogallol, 15.8 g m-diisopropenylbenzene and 2.0 g p-toluenesulfonic acid monohydrate in 150 ml ethanol were reacted essentially as in Example 11-B to give 33.4 g of a product mixture containing greater than 90 percent of alpha,alpha'-bis-(2,3,4-trihydroxyphenyl)-1,3-diisopropylbenzene.

EXAMPLE 13

Alpha,alpha'-bis(2,4-dihydroxyphenyl)-1,3-diisopropylbenzene 88.1 g Resorcinol, 15.8 g m-diisopropenylbenzene, 2.0 g p-toluenesulfonic acid monohydrate in 150 ml of ethanol were reacted for 41 hours at ambient temperature. The product was precipitated from water, washed with water, and vacuum dried at 60° C. About 33.7 g of a product mixture was obtained that was at least 92 percent pure.

EXAMPLE 14

Alpha,alpha'-bis-(2,4-dihydroxyphenyl)-1,4-diisopropylbenzene 110.0 g Resorcinol, 15.8 g p-diisopropenylbenzene and 200 ml glacial acetic acid were added to a flask and heated to about 70° C. to dissolve the reactants. Anhydrous hydrogen chloride was condensed into the reaction mixture until saturated. The reaction was allowed to cool and stand at ambient temperature for 17 hours. The product was precipitated in water, washed with water and vacuum dried at 60° C. About 29.1g of product with a melting point of about 110° to 115° C. was obtained.

The PACs prepared in accordance with Examples 15 to 21 were all characterized by analytical procedures accepted in the art. High pressure liquid chromatography was particularly useful to determine the product mixtures in the polyesters.

EXAMPLE 15

An Oxo-diazonaphthalene-sulfonate Mixed Ester of 2,3,4-Trihydroxybenzophenone

To a 25-L flask equipped with a constant temperature bath, thermometer, mechanical stirrer, and 2 1-L addition funnels were added 550 g (2.50 moles) of 2,3,4-trihydroxybenzophenone, 750 g (2.80 moles) of 1-oxo-2-diazonaphthalene-5-sulfonyl chloride and 11.350 L of reagent grade acetone. While the mixture was maintained at 20° C.±0.3° C., 1425 g (1.61 moles) of 12 percent sodium carbonate was added dropwise over 100 minutes. After the base addition, the reaction mixture was allowed to stir for 60 minutes at about 20° C. 250 ml of concentrated HCl was then slowly added to the mixture while keeping its temperature below 26° C. The reaction solution was filtered to remove the bulk of the NaCl, and the filtrate was added to 50 L of 1 percent HCl. The precipitated solid was stirred one hour, filtered and collected. The solid was slurried twice in 25 L of deionized water, filtered and vacuum dried to 0.1 mm Hg at ambient temperature. About 1100 g (85 percent of the theory) of a yellow, free flowing product containing about 34 percent by weight triester was obtained. By changing the ratio of the 1-oxo-2-diazonaphthalene-5-sulfonyl chloride to 2,3,4-trihydroxybenzophenone, the percent by weight of triester in the PAC product, and thus the percent by weight of PAC molecules without acidic hydrophilic groups, can be adjusted as desired.

Examples 16 and 17 demonstrate the utility of preparing acetylated photoactive polyester compounds containing either low or high levels of the acetyl group. Intermediate levels of acetylation can be achieved by adjusting the amount of the acetylation reactant added to the reaction mixture. This method is useful for controlling the percent by weight of the PAC molecules without acidic hydrophilic groups.

EXAMPLE 16

Preparation of a 50 Percent Acetylated Mixed Oxo-diazonaphthalene-sulfonate Ester of 2,3,4-Trihydroxybenzophenone To a 5-L round bottom flask equipped with a mechanical stirrer, thermometer, and a 50-ml addition funnel was added: (1) 50 g of a mixed 1-oxo-2-diazonaphthalene-5-sulfonate ester of 2,3,4-trihydroxybenzopheone containing approximately 0.19 equivalents per mole of unreacted hydroxy groups, (2) 0.1 g of dimethylaminopyridine, and (3) 10 g (0.098 moles) of acetic anhydride. After dissolving the mixture in 3000 ml of reagent grade acetone at ambient temperature, 300 ml of deionized water was added, followed by the dropwise addition of 9.8 g (0.098 moles) of triethylamine. The reaction temperature was kept at 45° C. during the addition. The mixture was allowed to stir for one hour and then slowly poured into 8 L of 2 percent HCl. The precipitated solid was stirred for one hour and then filtered. The filter cake was broken up and slurried twice in 2 L of deionized water. The product was dried under 125 mm Hg pressure at ambient temperature. The yield, 49 g, was approximately 80 percent of theory. Greater than 80 percent by weight of the product molecules were free of acidic hydrophilic groups.

EXAMPLE 17

Preparation of a Fully Acetylated Mixed Oxo-diazonaphthalene-sulfonate Ester of 2,3,4-Trihydroxybenzophenone To a 2-L round bottom flask equipped with an ice bath, mechanical stirrer, thermometer, and a 50-ml addition funnel 40 g of a mixed 1-oxo-2-diazonaphthalene-5-sulfonate ester of 2,3,4-trihydroxybenzophenone (having approximately 39 percent triester and 0.152 equivalents per mole free hydroxyl), was dissolved in 150 g (1.47 moles, 9 fold excess) acetic anhydride at ambient temperature. After the dissolution was completed, 100 ml of 50 percent sodium hydroxide was added dropwise at such a rate as to keep the temperature below 55° C. The mixture was allowed to stir for one hour after the addition to insure complete reaction of the anhydride. The resulting mixture was slowly added to 3 L of 2 percent HCl. The precipitate was stirred one hour in the HCl solution and then filtered. The filter cake was broken up and slurried twice in 2 L of deionized water. The product was dried at ambient temperature and at a pressure of about 125 mm Hg. About 35 g (75 percent of theory) of product was recovered, and found to be essentially free of molecules with acidic hydrophilic groups.

EXAMPLE 18

Oxo-diazonaphthalene-sulfonate Esters of Alpha,alpha'-bis(2,3,4-trihydroxyphenyl)-1,4-diisopropylbenzene In a 5-L 3-neck round bottom flask equipped with a thermometer, mechanical stirrer, and a 1-L addition funnel, 69.5 g (0.17 moles) of alpha, alpha'-bis(2,3,4-trihydroxyphenyl)-1,4-diisopropylbenzene and 314 g (1.17 moles, 15 percent excess) of 1-oxo-2-diazonaphthalene-5-sulfonyl chloride were dissolved in 3 L of acetone at ambient temperature. After the dissolution was completed, 300 ml of deionized water was slowly added, followed by 5 g of dimethylaminopyridine. To the resulting mixture, 118 g (1.17 moles) of triethylamine was added dropwise with stirring at such a rate as to keep the temperature at or below 35° C. Following the addition, the mixture was stirred for one hour, and then filtered through a course filter to remove insolubles. The product was precipitated by slowly adding to 6 L of 2 percent HCl. The precipitate was stirred one hour in the precipitation media and then filtered. The solid was broken up and slurried twice in 2 L of deionized water, twice in 4 L of methanol, filtered and vacuum dried at ambient temperature at a pressure of about 125 mm Hg. About 184 g (60 percent of theory) of a yellow solid was obtained and found to be essentially free of molecules with acidic hydrophilic groups.

EXAMPLE 19

Oxo-diazonaphthalene-sulfonate Esters of Alpha,alpha'-bis(2,3,4-Trihydroxyphenyl)-1,3-diisopropylbenzene In a 2-L 3-neck round bottom flask equipped with a thermometer, mechanical stirrer, and a 250-ml addition funnel, 5 g (0.012 moles) of alpha,alpha'-bis (2,3,4-trihydroxyphenyl)-1,3-diisopropylbenzene and 40.3 g (0.15 moles, 50 percent excess) of 1-oxo-2-diazonaphthalene-5-sulfonyl chloride were dissolved in 1 L acetone at ambient temperature. After the dissolution was completed, 166 ml of 12 percent sodium carbonate was added dropwise with stirring over 30 minutes. The reaction mixture was stirred for one hour, and then slowly poured into 6 L of 2 percent HCl. The precipitate was stirred one hour and then filtered. The solid was broken up and slurried twice in 1 L of deionized water, twice in 1 L of methanol, filtered and vacuum dried at ambient temperature at pressure of about 125 mm Hg. About 17 g (77 percent of theory) of a yellow solid was obtained and found to be essentially free of molecules with acidic hydrophilic groups.

EXAMPLE 20

Oxo-diazonaphthalene-sulfonate Esters of Alpha,alpha'-bis-(2,4-dihydroxyphenyl)-1,3-diisopropylbenzene In a 3-L round bottom flask equipped with a thermometer, mechanical stirrer, and a 500-ml addition funnel, 15.0 g (0.0395 moles) of alpha,alpha'-bis-(2,4-dihydroxyphenyl)-1,3-diisopropylbenzene and 73.0 g (0.272 moles) of 1-oxo-2-diazonaphthalene-5-sulfonyl chloride were dissolved in 2.5 L of reagent grade acetone. After the dissolution was complete, 241 ml of 12 percent sodium carbonate was added dropwise over 30 minutes. The mixture was then stirred one hour and the product precipitated into 6.2 L of 1 percent HCl. The precipitated solid was stirred for one hour and then filtered. The solid was broken up and slurried twice in 2 L of deionized water, twice in 4 L of methanol, filtered and vacuum dried at ambient temperature at a pressure of about 125 mm Hg. About 42 g (81 percent of theory) of a yellow solid was obtained and found to be essentially free of molecules with acidic hydrophilic groups.

EXAMPLES 21 through 110

Solubility of PACs in Pure Solvents

The following examples consist of mixtures of 5.4 percent PAC, selected from a group of 4 different PACs, and 94.6 percent of a pure solvent selected from a group of 26 different solvents with widely ranging solubility parameters. These mixtures were formulated at room temperature and mixed thoroughly. The resultant mixtures were then inspected to see whether or not the PAC dissolved completely. Table II lists the 26 pure solvents in Column A along with their corresponding solubility parameters in columns B, C, D, and E, which respectively contain the dispersive, polar, hydrogen bonding, and total contributions. Columns G, H, I and J report the results for Examples 21 through 110 concerning the solubility of the PAC's in the pure solvents. For example, a "1" in column G indicates that the substantially pure 1-oxo-2-diazonaphthalene-sulfonate triester of 2,3,4-trihydroxybenzophenone, "triester," prepared according to a method such as that described in Example 15, is completely soluble in pure solvent, while a "0" in column G indicates that the triester is not soluble. Columns H, I and J, respectively, report results for examples using the hexa-DAQ PAC, "hexaester," of Example 18 and two different mixed-DAQ PACs, "mixed esters-1 and -2," containing 1 to 3 1-oxo-2-diazonaphthalene-5-sulfonate groups per ballast molecule.

Table II shows that solvents with solubility parameters in the range of this invention will solubilize at least one, and usually more than one, of the four types of PACs listed. The converse is also true, with only a few exceptions. Thus, these examples demonstrate the high intrinsic solubility, and therefore high stability of the corresponding photoresists, of PACs in the solvents with solubility parameters within the region described in this invention.

TABLE II

PAC Solubility versus Solvent

| A Solvent | B dispersive | C polar | D hydrogen | E total | G Triester Example | Result | H Hexaester Example | Result | I Mixed Ester - 1 Example | Result | J Mixed Ester - 2 Example | Result |
|---|---|---|---|---|---|---|---|---|---|---|---|---|
| butrolactone,gamma- | 9.11 | 5.98 | 6.83 | 12.87 | 21 | 1 | 45 | 1 | 65 | 1 | 89 | 1 |
| dimethyl formamide | 8.53 | 6.72 | 5.54 | 12.16 | 22 | 1 | 46 | 1 | 66 | 1 | 90 | 1 |
| ethyl lactate | 5.77 | 5.37 | 6.93 | 10.50 | 23 | 0 | 47 | 1 | 67 | 1 | 91 | 1 |
| cyclopentanone | 7.94 | 5.42 | 4.29 | 10.53 | 24 | 1 | 48 | 1 | 68 | 1 | 92 | 1 |
| cyclohexanone | 7.64 | 4.58 | 5.39 | 10.42 | 25 | 1 | 49 | 1 | 69 | 1 | | |
| methyl benzoate | 7.76 | 5.60 | 3.51 | 10.19 | 26 | 1 | 50 | 1 | 70 | 1 | 93 | 1 |
| 1,4 dioxane | 7.96 | 4.94 | 3.84 | 10.13 | 27 | 0 | 51 | 1 | 71 | 1 | 94 | 1 |
| methylene chloride | 6.55 | 5.71 | 4.70 | 9.88 | 28 | 0 | 52 | 1 | 72 | 1 | 95 | 0 |
| acetone | 6.37 | 4.79 | 5.39 | 9.62 | 29 | 1 | 53 | 0 | 73 | 1 | 96 | 1 |
| Diacetone alcohol | 5.21 | 5.56 | 6.14 | 9.78 | | | | | | | 97 | 1 |
| anisole | 7.68 | 5.04 | 3.26 | 9.74 | 30 | 0 | 54 | 0 | 74 | 1 | 98 | 1 |
| egmmea [1] | 7.02 | 4.41 | 4.33 | 9.35 | 31 | 0 | | | 75 | 1 | 99 | 1 |
| pgmmea [2] | 6.91 | 4.51 | 3.82 | 9.09 | 32 | 0 | 55 | 0 | 76 | 1 | 100 | 1 |
| tetrahydrofuran | 6.52 | 5.36 | 3.25 | 9.05 | 33 | 0 | | | 77 | 1 | 101 | 1 |
| ethyl-3-ethoxy-propionate | 6.98 | 4.13 | 3.89 | 8.99 | 34 | 0 | 56 | 0 | 78 | 1 | 102 | 0 |
| 2-heptanone | 7.38 | 3.73 | 3.52 | 8.98 | 35 | 0 | 57 | 0 | 79 | 0 | 103 | 1 |
| ethyl acetate | 6.55 | 4.20 | 4.35 | 8.91 | 36 | 0 | 58 | 0 | 80 | 1 | 104 | 0 |
| ethylene glycol | 4.93 | 7.37 | 14.56 | 17.05 | 37 | 0 | 59 | 0 | 81 | 1 | 105 | 0 |
| 2-propanol | 6.86 | 4.79 | 7.81 | 11.45 | | | 60 | 0 | | | 106 | 0 |
| n-pentanol | 7.25 | 4.44 | 7.17 | 11.12 | 38 | 0 | | | 82 | 0 | | |
| n-hexanol | 7.34 | 4.17 | 6.68 | 10.77 | 39 | 0 | | | 83 | 0 | | |
| chlorobenzene | 8.49 | 4.59 | 0.00 | 9.65 | 40 | 0 | 61 | 0 | 84 | 0 | 107 | 0 |
| xylene | 8.07 | 3.44 | 0.97 | 8.83 | 41 | 0 | 62 | 0 | 85 | 0 | 108 | 0 |
| diethyl carbonate | 8.14 | 1.52 | 2.99 | 8.77 | 42 | 0 | | | 86 | 0 | | |
| n-butyl acetate | 7.09 | 3.79 | 3.30 | 8.69 | 43 | 0 | 63 | 0 | 87 | 0 | 109 | 0 |
| amyl acetate,n | 7.01 | 3.56 | 2.78 | 8.34 | 44 | 0 | 64 | 0 | 88 | 0 | 110 | 0 |
| acetol | 4.50 | 6.46 | 9.49 | 12.33 | 160 | 0 | 149 | 1 | 182 | 0 | 171 | 1 |
| butyl butyrate | 7.15 | 3.37 | 3.02 | 8.46 | 161 | 0 | 150 | 0 | 183 | 0 | 172 | 0 |
| Ethyl 2-ethoxy-2-hydroxyacetate | 5.06 | 4.40 | 5.34 | 8.57 | 163 | 1 | 152 | 1 | 185 | 1 | 174 | 1 |
| Ethyl 2-hydroxyisobutyrate | 5.01 | 5.01 | 5.22 | 8.80 | 164 | 0 | 153 | 0 | 186 | 1 | 175 | 1 |
| Ethyl acetoacetate | 6.51 | 5.42 | 4.98 | 9.83 | 162 | 1 | 151 | 0 | 184 | 1 | 173 | 1 |
| Ethyl pyruvate | 5.78 | 5.83 | 5.23 | 9.73 | 165 | 1 | 154 | 0 | 187 | 1 | 176 | 1 |
| Hexyl acetate | 7.30 | 3.40 | 3.13 | 8.64 | 166 | 0 | 155 | 0 | 188 | 0 | 177 | 0 |
| Malonaldehyde tetramethyl acetal | 6.26 | 4.21 | 3.96 | 8.52 | 169 | 0 | 158 | 0 | 191 | 0 | 180 | 0 |
| Methyl acetoacetate | 6.65 | 5.94 | 5.84 | 10.66 | 167 | 1 | 156 | 1 | 189 | 1 | 178 | 1 |
| Methyl isobutyl ketone | 6.90 | 3.92 | 3.02 | 8.49 | 168 | 0 | 157 | 0 | 190 | 0 | 179 | 0 |
| Pyruvic aldehyde dimethyl acetal | 6.81 | 4.27 | 4.58 | 9.25 | 170 | 1 | 159 | 0 | 192 | 1 | 181 | 1 |

[1] egmmea is ethylene glycol monoethyl ether acetate
[2] pgmmea is propylene glycol monomethyl ether acetate

EXAMPLES 111 through 113

Solubility of PACs in Mixed Solvents

The following examples demonstrate the usefulness of combining two solvents, each with solubility parameters outside the region of this invention, to give a resultant mixture with solubility parameters within the region of this invention. Whereas the individual solvents show low solubility for the substantially pure triester PAC of Example 15, the appropriate combination of them displays a high solubility.

Example 111

| Example 111 | |
|---|---|
| Solvent: 4-hydroxy-4-methyl-2-pentanone | 1.34 g |
| Substantially pure triester PAC of Example 15 (5.4 percent of composition) | .076 g |
| Example 112 | |
| Solvent: monochlorobenzene | .99 g |
| Substantially pure triester PAC of Example 15 (5.4 percent of composition) | .056 g |
| Example 113 | |
| Solvent: 4-hydroxy-4-methyl-2-pentanone and monochlorobenzene, in the ratio of 54:46 | 1.37 g 1.17 g |
| Substantially pure triester PAC of Example 15 (5.4 percent of composition): | 0.145 g |

The compositions of Examples 111, 112 and 113 were shaken vigorously for a specified period and observed. Table III indicates under the "Soluble" column, whether the PAC dissolved completely. Also given are the calculated solubility parameters for the solvent mixtures.

TABLE III

Solubility Parameter and Solubility Data

| Composition | $\delta_d$ | $\delta_p$ | $\delta_h$ | Soluble |
|---|---|---|---|---|
| Example 111 | 5.21 | 5.56 | 6.14 | no |
| Example 112 | 8.49 | 4.59 | 0.00 | no |
| Example 113 | 6.71 | 5.11 | 3.31 | yes |

Table III also indicates that neither the monochlorobenzene composition nor the 4-hydroxy-4-methyl-2-pentanone alone are capable of individually solvating the triester PAC. The solubility parameters of these individual materials are outside the region of this invention. When the above two solvents are combined to produce a solvent mixture with overall solubility parameters lying within the region of this invention, as in composition of Example 195 (see Table III), the resultant solvent mixture dissolves the triester PAC.

EXAMPLES 114 through 118

Determination of Optical Contrast of Photoactive Compounds

Optical contrast was measured for several PAC's in acetonitrile solution using a Hewlett-Packard 8450A ultraviolet-visible spectrometer. The initial absorption, $A_0$, at 350 nm was determined. The solution was photobleached by exposure to a large dose of ultraviolet light and the bleached absorption, $A_b$, at 350 nm was determined. Optical contrast, OC, was determined according to the following equation: $OC = (A_0 - A_b)/(A_0 + A_b)$. Values of OC greater than 80 percent indicate a high degree of photobleachability, which allows for higher resolution. The PACs examined are: Example 114, the photoactive compounds of Example 15 prepared with a tri-DAQ content of 34.5 weight percent; Example 197, the PACs of Example 15 prepared with a tri-DAQ content of 74.0 percent; Example 116, the photoactive compounds of Example 15 prepared with a tri-DAQ content of 96.5 percent; Example 117, the PACs of Example 16; Example 118, the PACs of Example 18.

Results are tabulated in Table IV. PACs B-E show excellent optical contrast, which will allow for better resolution.

TABLE IV
Examples 114 through 118
Optical Contrast of Photoactive Compounds

| Example | PAC | Optical Contrast, Percent |
|---|---|---|
| 114 | A | 70 |
| 115 | B | 88 |
| 116 | C | >95 |
| 117 | D | >95 |
| 118 | E | >95 |

EXAMPLE 119

Measurement of Photoproduct Dissolution Rate Dependence

We have measured the dependence of exposed photoresist dissolution rate upon the relative concentrations of the photoproducts $m_0$-$m_3$ of a tri-DAQ PAC through a method based upon the principles described in the Detailed Description of this invention. A PAC consisting of a 96.5 weight-percent pure 1-oxo-2-diazonaphthalene-5-sulfonate triester of 2,3,4-trihydroxybenzophenone was prepared as described in Example 15. 5.00 g of this PAC was dissolved into 43.70 g of warm cyclopentanone to which 25.19 g of acetone and 5.38 g of water were added. This solution was placed into a 20×2.5-cm quartz photolysis tube and was magnetically stirred. This solution was photolyzed in a Rayonet RPR-100 photoreactor equipped with 16 365 nm high pressure Hg lamps for 6 hours. 16 to 18 g aliquots were removed periodically to sample the PAC at various degrees of photolysis. This procedure produced samples of homogeneously photolyzed PACs. The photolyzed PAC was recovered in the aliquots by adding the solution to 100 g of slightly acidified water immediately following photolysis, collecting the precipitate on a filter, and drying in a vacuum oven.

Ultraviolet spectra of photolyzed PAC were measured in a 25:1 acetonitrile:cyclopentanone solution on a Hewlett-Packard 8450A ultraviolet spectrophotometer versus a solvent blank. The absorbance, $\epsilon$, at 353nm (the absorption maximum), of the photolyzed PAC was determined in units of ml solution/gram of PAC. The relative absorbance, a, was determined by $a = (\epsilon_{sample} - \epsilon_{bleached})/(\epsilon_{original} - \epsilon_{bleached})$ where $\epsilon_{sample}$ is the absorbance of the sample being measured, $\epsilon_{original}$ is the absorbance of a sample prior to irradiation and $\epsilon_{bleached}$ is the absorbance of a fully bleached sample.

Resist formulations containing the above photolyzed PAC's were prepared in order to measure the resist dissolution rate in developer as a function of degree of photolysis. 0.650 g of dried photolyzed PAC prepared as detailed above was combined with 2.863 g of novolac resin, prepared as described in Example 1, and dissolved into a solvent mixture consisting of 9.09 g of propylene glycol monomethyl ether acetate and 0.91 g of anisole, followed by filtration through a 0.2 μm Teflon filter.

Films from these resists were spin-cast onto silicon wafers using an SVG automated wafer-hotplate track and soft-baked at 100° C. for 45 seconds to give films with a nominal thickness of 1.25 μm. Average initial film thickness was measured by a Nanometrics Nanospec. The wafers were developed in 0.245 N tetramethylammonium hydroxide (TMAH)/water developer at 21.5° C. for 5 to 150 seconds. Average final film thickness was measured by a Nanometrics Nanospec. The dissolution rate, in A°/sec, was calculated by dividing the change in film thickness by the development time.

Table V summarizes results from absorbance and dissolution rate experiments described in this Example.

Total relative photoproduct concentration, m*, was determined from the relative absorbance, a, by $m^* = 1 - a$. Resist dissolution rate was plotted as a function of photoproduct concentration to give a highly non-linear dependence on total photoproduct concentration (Diagram 3), indicating high contrast and a threshold-like response.

The concentration of the final tri-ICA photoproduct, indenecarboxylic acid sulfonyl triester of trihydroxybenzophenone, $m_3$, was determined by the following relationship $m_3 = (1-a)^3$ (Diagram 4). Resist dissolution rate was plotted as a function of $m_3$, showing a strong linear dependence of the dissolution rate on the final tri-ICA photoproduct concentration and minimal dependence on mono- and di-ICA photoproduct concentration. As shown in this Example, high contrast is expected when the dissolution rate is essentially dependent upon the photoproducts with three or more ICA groups attached to the same ballast molecule.

TABLE V
Example 119
Measurement of Photoproduct Rate Dependence

| Photolyzed Sample | $\epsilon$ at 353 nm | Relative Absorption (a) | Dissolution Rate, A°/s |
|---|---|---|---|
| 1 | 28900 | 1.000 | 0.29 |
| 2 | 25028 | 0.857 | 0.49 |
| 3 | 22795 | 0.774 | 0.86 |
| 4 | 20019 | 0.671 | 1.85 |
| 5 | 17628 | 0.583 | 58.4 |
| 6 | 16834 | 0.553 | 98.7 |
| 7 | 16004 | 0.523 | 151.5 |
| 8 | 9153 | 0.269 | 606.4 |
| 9 | 7663 | 0.214 | 921.9 |
| 10 | 1879 | 0.000 | 1693.9 |

EXAMPLES 120 through 126

Measurement of Resist Contrast and Photospeed

A series of lithographic experiments were conducted in order to determine the dependence of resist contrast and resolution on the number of DAQ groups bonded to the same ballast group. Resist compositions containing the high resolution novolac resin of Example 1, and the PAC, a 1-oxo-2-diazonaphthalene-5-sulfonate polyester of trihydroxybenzophenone of Example 15, are evaluated in a variety of developer concentrations. The tri-DAQ content of the PAC in these compositions was varied between 34.5 to 96.5 weight percent, with the remainder consisting of mono-DAQ esters, di-DAQ esters and free trihydroxybenzophenone.

Five photoresist compositions (Examples 120 to 124 in Table VI) were prepared according to the following formula: 2.831 g of PAC and 12.47 g of novolac resin were dissolved into 4.064 g of anisole and 40.636 g of propylene glycol monomethyl ether actetate. These compositions were then filtered through a 0.2 μm Teflon filter into a clean bottle.

In order to determine the lithographic effect of varying the solvent composition and the effect of varying the PAC concentration, two additional compositions (Examples 125 and 126 in Table VI) were prepared according to the following formula: Example 125; 2.007 g of PAC and 10.693 g of novolac resin was dissolved into 3.391 g of anisole and 33.91 g of propylene glycol monomethyl ether actetate. This composition was then filtered through a 0.2 μm Teflon filter into a clean bottle. Example 126; 2.007 g of PAC and 10.693 g of novolac resin was dissolved into 5.036 g of anisole, 5.036 g of amyl acetate and 27.23 g of ethyl lactate. This composition was then filtered through a 0.2 μm Teflon filter into a clean bottle.

The thusly prepared photoresists were evaluated as follows: 23 4-inch silicon wafers were spin-coated with resists of Examples 120 to 126 on a SVG coater-hotplate track to give a 1.2 μm film of photoresist and baked at 100° C. for 45 seconds. Initial average film thickness was measured with a Nanometrics Nanospec. The films were irradiated with UV light dosages of 30 to 300 mJ/cm$^2$ through a Ditric gradient density step tablet mask to give varying exposures on the photoresist surfaces. The compositions were developed in TMAH/water developer of concentrations between 0.213 and 0.299 molar at 22° C. The developed film thicknesses were measured and the normalized film thicknesses plotted against the logarithm of the exposure dose in order to generate a contrast curve. A straight line plot was obtained by extrapolation.

The results are tabulated in Table VI. It is readily observed that resist compositions containing a PAC with a high tri-DAQ content can have excellent contrast. Resist contrast can be improved by using developer solutions of certain normalities. Comparison of compositions F and G show that high contrast can be obtained in both solvents, and that solvent composition can also affect resist performance.

In the experiments where the PAC had tri-DAQ contents greater than about 50 weight percent, i.e., greater than 50 percent by weight of the PAC molecules without acidic hydrophilic groups (Examples 120 through 123, and Examples 125 and 126, Table VI), highest contrast was obtained. These results are consistent with Example 119, which showed that photoresist compositions based on the same PAC's and resin processed with the same developers as this example should have high contrast. In Example 119, it was shown how the tri-ICA photoproduct controls dissolution in this type of composition. The high-contrast compositions of Examples 120 to 123 and Examples 125 and 126 are consistent with the property of the tri-ICA photoproduct controlling photoresist dissolution. It is readily apparent that high contrast occurs only when certain photoresist compositions are used in combination with the certain developers.

These results can be compared to the use of a different photoresist composition containing 1-oxo-2-diazonaphthalene-5-sulfonate triester of trihydroxyoxyphenyl alkyl ketone described in U.S. Pat. No. 4,588,670 which have a lower contrast, ranging from 1.22 to 1.95. The photoresist compositions of this present invention have higher contrast in similar developers, ranging from 2.24 to 3.33. The property of higher contrast described in this invention is the result of using a composition containing a different combination of resin, PAC and solvent in a tetramethyl ammonium developer of the correct concentration so that the dissolution rate in developer can be essentially controlled by photoproducts of the PAC which have three or more indene-carboxylic acid groups bonded to the same ballast molecule.

TABLE VI

Examples 120 through 126
Photospeed and Contrast

| Example | Percent Tri-DAQ Content | •Developer Concentration | Photospeed, mJ/cm$^2$ | Contrast |
|---|---|---|---|---|
| 120 | 96.5 | 0.213 | 66.9 | 3.06 |
| 120 | 96.5 | 0.233 | 56.0 | 3.33 |
| 120 | 96.5 | 0.245 | 51.6 | 3.13 |
| 120 | 96.5 | 0.273 | 38.4 | 3.29 |
| 120 | 96.5 | 0.299 | 30.4 | 3.12 |
| 121 | 80.0 | 0.213 | 53.5 | 3.08 |
| 121 | 80.0 | 0.233 | 49.7 | 2.55 |
| 121 | 80.0 | 0.245 | 42.5 | 2.76 |
| 121 | 80.0 | 0.273 | 29.4 | 2.77 |
| 121 | 80.0 | 0.299 | 21.9 | 2.36 |
| 122 | 72.0 | 0.213 | 50.3 | 3.03 |
| 122 | 72.0 | 0.233 | 41.5 | 2.94 |
| 122 | 72.0 | 0.245 | 35.4 | 2.90 |
| 122 | 72.0 | 0.273 | 24.3 | 2.62 |
| 123 | 62.0 | 0.213 | 44.2 | 2.75 |
| 123 | 62.0 | 0.233 | 35.4 | 2.58 |
| 123 | 62.0 | 0.245 | 29.8 | 2.66 |
| 123 | 62.0 | 0.273 | 19.3 | 2.24 |
| 124 | 34.5 | 0.213 | 26.5 | 1.88 |
| 124 | 34.5 | 0.233 | 18.3 | 1.85 |
| 124 | 34.5 | 0.245 | 13.3 | 1.76 |
| 125 | 72.0 | 0.245 | 29.3 | 2.61 |
| 126 | 72.0 | 0.245 | 29.5 | 2.47 |

•Developer concentrations in moles/liter.

EXAMPLES 127 through 131

Measurement of Unexposed Film Thickness Remaining After Development

Unexposed film thickness remaining after 60 seconds development in 0.245 M TMAH/water developer was measured and is tabulated in Table VII. Initial average film thickness and final film thickness was measured on a Nanometrics Nanospec. The unexposed film thickness remaining after development is excellent, better than 99.0 percent for the compositions of Examples 127 through 131, which have a tri-DAQ content of over 44 percent in the PAC.

TABLE VII

Examples 127 through 131
Unexposed Film Thickness Remaining After Development

| Example | Composition of Example | Percent, Tri-DAQ Content | Developer Concentration | *FTR, Unexposed |
|---|---|---|---|---|
| 127 | 120 | 96.5 | 0.213 | |
| 127 | 120 | 96.5 | 0.233 | |
| 127 | 120 | 96.5 | 0.245 | 99.1 |
| 127 | 120 | 96.5 | 0.273 | |
| 127 | 120 | 96.5 | 0.299 | |
| 128 | 121 | 80.0 | 0.213 | |
| 128 | 121 | 80.0 | 0.233 | |
| 128 | 121 | 80.0 | 0.245 | 99.8 |
| 128 | 121 | 80.0 | 0.273 | |
| 128 | 121 | 80.0 | 0.299 | |
| 129 | 122 | 72.0 | 0.213 | |
| 129 | 122 | 72.0 | 0.233 | |
| 129 | 122 | 72.0 | 0.245 | 99.7 |
| 129 | 122 | 72.0 | 0.273 | |
| 130 | 123 | 62.0 | 0.213 | |
| 130 | 123 | 62.0 | 0.233 | |
| 130 | 123 | 62.0 | 0.245 | 99.5 |
| 130 | 123 | 62.0 | 0.273 | |
| 131 | 124 | 34.5 | 0.213 | |
| 131 | 124 | 34.5 | 0.233 | |
| 131 | 124 | 34.5 | 0.245 | 91.9 |

Developer concentrations in moles/liter.
*"FTR" is percent film thickness remaining after development.

EXAMPLES 132 through 138

Measurement of Slightly Exposed Film Thickness Remaining After Development

Film thickness remaining after slight exposure is detailed in Table VIII. In these experiments, the dose was varied between 0.5 an 2.0 mJ/cm$^2$. Initial average film thickness and final film thickness were measured on a Namometrics Nanospec. Exposure was followed by development in TMAH/water developers at the concentrations given in Table VIII. The film thickness remaining after partial exposure is excellent, better than 97 percent for compositions of Examples 132 through 135, 137 and 138.

In a lithographic process, it is highly desirable to maximize unexposed and slightly exposed film thickness remaining after development. The resist compositions claimed in this invention have excellent performance in this respect. High film thickness remaining after development and high film thickness remaining after slight exposure are evidence that the dissolution rate in developer is essentially controlled by photoproducts of the PAC which have three or more indene-carboxylic acid groups bonded to the same ballast molecule, giving a characteristic threshold-energy type dissolution response to development.

These results can be compared to photoresist compositions given in Japanese Patent 60/121445 and European Patent Application No. 85300184.0, which have the property of poor unexposed film thickness remaining after development, typically in the range of 87.0 to 93.5 percent. The slightly exposed film thickness remaining after development properties of the compositions given in Japanese Patent 60/121445 and European Patent Application No. 85300184.0 could be expected to be proportionally further diminished. The resist compositions of Japanese Patent 60/121445 and European Patent Application No. 85300184.0 contain photoactive compounds with two or more 1-oxo-2-diazonaphthalene-5-sulfonate residues bonded to the same ballast molecule. The property of decreased film thickness remaining after development in these compositions are evidence that the dissolution rate in developer is not essentially controlled by photoproducts of the PAC which have three or more indene-carboxylic acid groups bonded to the same ballast molecule. This diminished performance may be because these said compositions contained different resins and different solvents than those described in this present invention.

TABLE VIII

Examples 132 through 138
Slightly Exposed Film Thickness Remaining After Development

| Example | Composition of Example | Percent Tri-DAQ Content | *Developer Concentration | Slight Dose, mJ/cm$^2$ | *FTR, Slight Dose |
|---|---|---|---|---|---|
| 132 | 120 | 96.5 | 0.213 | 2.7 | 99.5 |
| 132 | 120 | 96.5 | 0.233 | 2.4 | 99.3 |
| 132 | 120 | 96.5 | 0.245 | 2.1 | 99.2 |
| 132 | 120 | 96.5 | 0.273 | 1.7 | 98.9 |
| 132 | 120 | 96.5 | 0.299 | 1.1 | 98.4 |
| 133 | 121 | 80.0 | 0.213 | 2.1 | 98.3 |
| 133 | 121 | 80.0 | 0.233 | 1.9 | 99.3 |
| 133 | 121 | 80.0 | 0.245 | 1.7 | 99.4 |
| 133 | 121 | 80.0 | 0.273 | 1.2 | 94.7 |
| 133 | 121 | 80.0 | 0.299 | 0.5 | 97.6 |
| 134 | 122 | 72.0 | 0.213 | 1.8 | 99.1 |
| 134 | 122 | 72.0 | 0.233 | 1.6 | 97.8 |
| 134 | 122 | 72.0 | 0.245 | 1.5 | 98.4 |
| 135 | 122 | 72.0 | 0.273 | 1.0 | 96.4 |
| 135 | 123 | 62.0 | 0.213 | 1.5 | 98.1 |
| 135 | 123 | 62.0 | 0.233 | 1.5 | 98.3 |
| 135 | 123 | 62.0 | 0.245 | 1.1 | 97.9 |
| 135 | 123 | 62.0 | 0.273 | 0.8 | 93.5 |
| 136 | 124 | 34.5 | 0.213 | 0.9 | 96.3 |
| 136 | 124 | 34.5 | 0.233 | 0.7 | 88.1 |
| 136 | 124 | 34.5 | 0.245 | 0.4 | 87.7 |
| 137 | 125 | 72.0 | 0.245 | 1.0 | 98.5 |
| 138 | 126 | 72.0 | 0.245 | 1.0 | 98.9 |

* Developer concentrations in moles/liter.
*"FTR" is percent film thickness remaining after development.

EXAMPLE 139

Measurement of Resist Resolution for Resists Containing Various Contents of Tri-DAQ PAC Resolution has an exact physical definition in terms of modulation of intensity between adjacent images (as described by P. S. Gwozdz, *Proc. SPIE*, Vol. 275 p. 156–164, 1981.) The most demanding and a proper method for measuring actual differences in resist resolution is to examine equal multiple equal line/space features printed on a phototool at a small enough feature size to degrade the aerial image of the light intensity (as explained by P. D. Flanner III, S. Subramanian and A. R. Neureuther, *Proc. SPIE*, Vol. 633, p. 239–244, 1986). For this purpose, we have used a Perkin-Elmer 341 scanning optical projector to print multiple equal 1.25 μm line/space patterns. Commercially available resists perform poorly under these conditions, giving very sloped sidewall angles and rounded tops of raised lines.

The resolution with resist compositions of Examples 120 through 126 were evaluated using 1.2 μm films which were track hot-plate soft-baked at 100° C. for 45 seconds and exposed in the said manner described above. Developer concentrations were varied. The printed line/space patterns were examined using scanning electron microscopy. The resolution with resist compositions of Examples 120, 121, 122, 125 and 126 were excellent giving features with good sidewall angles and a flat top surface. The resolution with the composition of Example 123 was slightly worse than the aforementioned. The resolution with the composition of Example 124 was poor, with a poor sidewall angle and rounded tops. The resolution with the composition of Example 124 was similar to the commercially available Shipley 1470 photoresist using Shipley 312 developer at the recommended dilution. Other commercially available photoresist products yield a resolution similar to that obtained with Shipley Microposit 1470.

Evaluations of the composition of Example 120, which contained PACs with tri-DAQ content of about 96.5 weight percent, exhibited residues adhering to the substrate surface. These residues persisted in all reasonable developer concentrations and developer processes. These residues, known as 'scum' by those familiar with the industry, would harm the production of microelectronic devices, and are highly undesirable. Evaluation of compositions of Examples 121 through 126 did not find any appreciable residue. Thus it appears, for photoresist compositions containing said resins, solvent and PAC's, that tri-DAQ contents of about 95-100 weight percent would be undesirable.

The resolution with compositions containing PACs with tri-DAQ contents between about 50 and 90 weight percent were quite good and superior to several commercially available products.

EXAMPLE 139A

Composition Containing Hexa-DAQ PAC

A composition consisting of 10.575 g of the resin of Example 1 and 1.925 g of the PAC of Example 18 were dissolved into a solvent consisting of 5.063 g of anisole, 5.063 g of amyl acetate and 27.535 g of ethyl lactate followed by filtration through a 0.2 $\mu$m Teflon filter. The photoresist was spin coated and track hot-plate baked to give 1.2 $\mu$m films, which were exposed to light in the manner described in Example 139. The resist was developed using 0.29 M TMAH/water developer at 22° C. for 60 seconds. Scanning electron microscopic evaluation showed high resolution in reproducing multiple equal 1.25 $\mu$m line/space features with good sidewall angles and a flat top surface.

EXAMPLE 140

Determination of Percent Non-Bleachability of Resist Compositions

Relative photobleachability was determined by examining the absorption spectra of 1.2 $\mu$m thick films of photoresist compositions containing said PACs of Examples 114 through 118, resin of Example 1 and the solvents of Example 146 spun on a quartz wafer. The resist was exposed to a substantial dose of ultraviolet light and the absorption spectra was re-examined. Percent non-bleachability at 365 nm and 436 nm was determined by dividing bleached absorption by the original absorption for the respective wavelengths.

Results are tabulated in Table IX. Resist compositions containing over 44 percent fully esterified phenolic ballast groups show bleachability to less than 20 percent of the original absorption, which allows for better resolution.

TABLE IX

Example 140
Percent Photobleachability of Resist Compositions

| Composition Containing PAC of Example | Percent Non-Bleachable at 365 nm | Percent Non-Bleachable at 436 nm |
|---|---|---|
| 114 | 29.3 | 9.2 |
| 115 | 7.8 | 4.3 |
| 116 | 1.2 | <1 |
| 16 | 3.5 | 2.1 |
| 18 | <2 | <1 |

EXAMPLE 141

Determination of Transparency of Resist Compositions in the Visible Spectrum Absorption in the visible spectrum, 450 nm to 650 nm, was examined for photoresist compositions containing the said PACs of Example 140. IN all cases, the percent transmission in the said spectral region was greater then 97 percent, demonstrating that these compositions are essentially transparent in the visible spectrum. Optical transparency in this spectral region is necessary for accurate mask alignment techniques. Results are tabulated in Table X.

TABLE X

Example 141
Visible Transparency of Resist Compositions

| Composition Containing PAC of Example: | Transparency |
|---|---|
| 114 | yes |
| 115 | yes |
| 116 | yes |
| 16 | yes |
| 18 | yes |

Examples 142 through 145 demonstrate positive working photoresist compositions containing novel resins of this invention. These resist compositions were evaluated essentially as described in Example 120.

EXAMPLES 142 through 146

Positive Photoresists Based on Novel Resins

| EXAMPLE 142 | | |
|---|---|---|
| Composition: | Resin of Example 3 | 21.83 g |
| | PAC of Example 15 | 4.16 g |
| | Ethyl lactate | 52.88 g |
| | Anisole | 9.78 g |
| | Amyl acetate | 9.78 g |
| Performance: | Photosensitivity, mJ/cm$^2$ | 71.1 |
| | Contrast | 2.83 |
| | Initial film thickness | 1.132 |
| EXAMPLE 143 | | |
| Composition: | Resin of Example 4 | 21.80 g |
| | PAC of Example 15 | 5.45 g |
| | Ethylcellusolve acetate | 64.00 g |
| | n-Butyl acetate | 7.11 g |
| Performance: | Photosensitivity, mJ/cm$^2$ | 33.7 |
| | Contrast | 1.59 |
| | Initial film thickness | 1.228 |
| EXAMPLE 144 | | |
| Composition: | Resin of Example 9 | 21.83 g |
| | PAC of Example 15 | 4.16 g |
| | Ethyl lactate | 52.88 g |
| | Anisole | 9.78 g |
| | Amyl acetate | 9.78 g |
| Performance: | Photosensitivity, mJ/cm$^2$ | 21.0 |
| | Contrast | 1.57 |
| | Initial film thickness | 1.227 |

EXAMPLE 145

| Composition: | Resin of Example 1 | 8.42 g |
|---|---|---|
| | PAC of Example 15 | 1.98 g |
| | Propylene glycol monomethyl ether acetate | 26.91 g |
| | Anisole | 2.69 g |
| Performance: | Photosensitivity, mJ/cm$^2$ | 37.7 |
| | Contrast | 2.69 |
| | Initial film thickness | 1.20 |

EXAMPLE 146

| Composition: | Resin of Example 2 | 8.53 g |
|---|---|---|
| | PAC of Example 15 | 1.87 g |
| | Propylene glycol monomethyl ether acetate | 26.91 g |
| | Anisole | 9.78 g |
| Performance: | Photosensitivity, mJ/cm$^2$ | 35.9 |
| | Contrast | 2.19 |
| | Initial film thickness | 1.20 |

EXAMPLES 147 and 148

Positive Photoresists Based on Novel Acetylated PACs

EXAMPLE 147

The following example demonstrates a positive working photoresist composition consisting of an acylated PAC prepared according to Example 16, a novolac resin prepared according to Example 1, and a preferred solvent mixture. Greater than 85 percent by weight of the PAC molecules were free of acidic hydrophilic groups.

| Composition: | |
|---|---|
| Novolac resin of Example 1: | 9.60 g |
| Acylated PAC of Example 16: | 2.40 g |
| Solvent: ethyl lactate, anisole, amyl acetate, in the ratio of 73:13.5:13.5: | 36.26 g |

The photoresist composition was spin coated onto 100-mm diameter bare silicon wafers and baked on a hot plate for 45 seconds at 100° C. to give films of 1.2 microns in thickness. Using these wafers, and a developer consisting of a 0.245 N TMAH in water, the photosensitivity and contrast of the photoresist was determined by the method described in Example 120 and found to be 50.3 mJ/cm$^2$ and 2.58, respectively.

EXAMPLE 148

The following example demonstrates a positive working photoresist using fully acylated PAC free of molecules with acidic hydrophilic groups prepared according to Example 17, a resin binder prepared according to Example 3 and a preferred solvent mixture.

| Composition: | |
|---|---|
| Resin of Example 3: | 6.02 g |
| Acylated PAC of Example 17: | 1.52 g |
| Solvent: ethyl lactate, anisole, amyl acetate, in the ratio of 73:13.5:13.5: | 23.10 g |

The photoresist composition was spin coated onto 100-mm diameter bare silicon wafers and baked on a hot plate for 45 seconds at 100° C. to give films of 1.2 microns in thickness. Using these wafers, and a developer consisting of a 0.245 N water solution of TMAH, the photosensitivity and contrast of the photoresist was determined by the method described in Example 120 and found to be 54.3 mJ/cm$^2$ and 2.52, respectively.

EXAMPLES 149 THROUGH 192

See Table II

EXAMPLE 193

The following example demonstrates the superior solvency of an anisole-ethyl lactate containing solvent mixture in dissolving an essentially fully esterified THBP PAC over an ethyl cellusolve acetate based solvent mixture commonly used to dissolve positive photoresist compositions.

| Resin of Example 1 | Solvent Mixture (parts/100) | Grams of PAC to Dissolve at 20° C. |
|---|---|---|
| 2.5 g | Anisole/Amyl acetate/Ethyl lactate (30/10/60) | 0.5 |
| 2.5 g | Ethyl cellusolve acetate/n-Butyl acetate (90/10) | 0.2 |

EXAMPLE 194

In order to show the superiority of the solvent mixtures according to this invention over the state of the art, the performance of the following resist compositions were compared with one another;

| A. | Resin of Example 1 | 21.00 g |
|---|---|---|
| | PAC of Example 15 | 5.25 g |
| | Ethyl lactate | 51.79 g |
| | Anisole | 9.58 g |
| | Amyl acetate | 9.58 g |
| B. | Resin of Example 1 | 18.21 g |
| | PAC of Example 15 | 4.55 g |
| | Ethyl lactate | 51.79 g |
| | Anisole | 9.58 g |
| | Chlorobenzene | 9.58 g |
| C. | Resin of Example 1 | 14.04 g |
| | PAC of Example 15 | 3.51 g |
| | Ethyl cellusolve acetate | 42.70 g |
| | n-Butyl acetate | 4.74 g |
| D. | Resin of Example 1 | 18.21 g |
| | PAC of Example 15 | 4.55 g |
| | Propylene clycol monomethyl ether acetate | 55.34 g |
| | Anisole | 6.15 g |

| Resist Compositions | Results | | | |
|---|---|---|---|---|
| | A | B | C | D |
| Film thickness at 4,000 rpm | 15,510 A | 17,989 A | 12,153 A | 14,249 A |
| Photospeed[1], EE (mj/cm$^2$) | 53.2 | 48.5 | 62.7 | — |
| Photosensitivity[1], Eo (mj/cm$^2$) | 22.36 | 22.12 | 24.24 | — |
| Contrast[1] (gamma) | 2.5 | 2.43 | 2.11 | — |

[1]Determined at a constant film thickness of 12,100 A +/−150 A.

These results show that resist compositions A and B of the present invention require lower percentage of solids to product a given film thickness of resist than the resist compositions C and D that are based on conventional solvents of prior art. The lower exposure dose required for resist compositions A and B allow higher wafer throughput per given time during the article manufacture and the higher contrast numbers of A and B are indicative of higher resolution capability.

EXAMPLE 195

The following example demonstrates the importance of an essentially pure ethyl lactate in resist compositions according to this invention. Two resist compositions were prepared essentially as described in Example 194 A. In one resist composition commercially available ethyl lactate (containing about 97 percent ethyl lactate, about 0.62 percent diethyl succinate and about 2.38 percent other impurities, as determined by standard gas chromatography method) was used. The other resist composition was prepared using a freshly distilled ethyl lactate that was determined by gas chromatography to be greater than about 99% pure and containing less than 0.10 percent diethyl succinate. Both resist samples were filtered through a 0.2 um filter before stored in a refrigerated environment for about four months. The samples were then spin coated onto clean silicon wafers and examined under monochromatic light. The films spun from the resist sample containing the commercial ethyl lactate typically showed about 120 visible particles per wafer while the resist films spun from the purified ethyl lactate were of high quality with no particles present.

Examples 196 and 197 demonstrate positive working photoresist compositions containing other good solvents according to this invention.

EXAMPLE 196

| Composition: | Resin of Example 1 | 15.48 g |
| | PAC of Example 15 | 3.70 g |
| | Ethyl 2-hydroxyisobutyrate | 33.48 g |
| | Anisole | 16.74 g |
| | Amyl Acetate | 5.58 g |
| Performance: | Photosensitivity, mj/cm$^2$ | 31.6 |
| | Contrast | 2.23 |
| | Film thickness | 1.2 μm |

EXAMPLE 197

| Composition: | Resin of Example 1 | 2.9 g |
| | 1-Oxo-2-diazonaphthalene-sulfonate esters of 4-benzylpyrogallol | 0.59 g |
| | Ethyl 3-methoxypropionate | 10.65 g |
| Performance: | Photosensitivity, mj/cm$^2$ | 32.0 |
| | Contrast | 2.25 |
| | Film thickness | 1.2 μm |

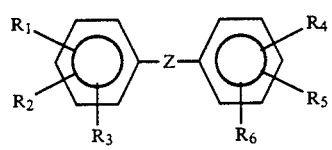

FORMULA 1

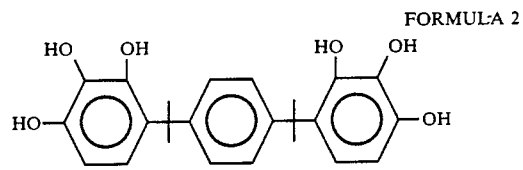

FORMULA 2

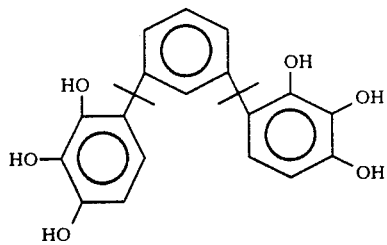

FORMULA 3

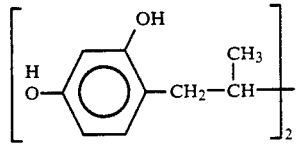

FORMULA 4

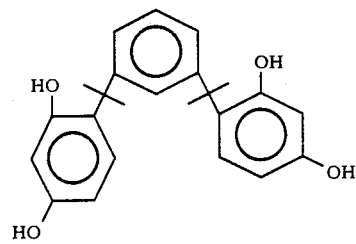

FORMULA 5

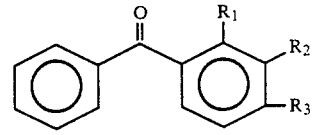

FORMULA 6

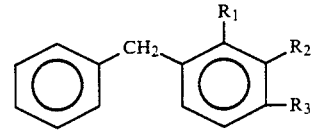

FORMULA 7

What we claim is:

1. A composition responsive to activating radiation to form a latent image developable with an aqueous alkali solution comprising at least one alkali soluble resin and at least one photoactive compound that is an ester or polyester derived from the reaction of an oxo-diazonaphthalene sulfonyl or carboxylic acid halide with a hydroxy or polyhydroxy ballast compound dissolved in a solvent mixture consisting of ethyl lactate, anisole and amyl acetate.

2. The composition of claim 1 where said solvent is ethyl lactate in predominant amount.

3. The composition of claim 1 further comprising one or more additives selected from the group consisting of colorants, dyes, anti-striation agents, plasticizers, speed-enhancers, contrast-enhancers and surfactants.

4. The composition of claim 1 coated on a solid support

5. The composition of claim 4, wherein said support is selected from the group consisting of semiconductor materials, metals, planarizing, barrier or etch-resistant types of organic or inorganic layers, underlying films and coatings, other types of resist films, antireflective coatings, plastic films, wood, paper, ceramics, glass, laminates, and textiles.

6. The composition of claim 4, wherein said support is selected from the group consisting of a silicon-based or 7. A positive working photoresist composition comprising an alkali soluble resin selected from the group of novolak resins and polyvinyl phenol resins and a photoactive compound that is an ester or polyester derived from the reaction of an oxo-diazonaphthalene sulfonyl or carboxylic acid halide with a hydroxy or polyhydroxy ballast compound responsive to activating radiation dissolved in a sufficient amount of a solvent to dissolve the resin and photoactive compound to form a single liquid phase coating composition where said solvent is a lactate having solubility parameters in units of $(cal/cm^3)^{0.5}$ of:

$\delta_d > 4.4$, $\delta_p > 3.6$, $\delta_h > 3.0$ and $\delta_p/\delta_h > 0.59$, in a purity of at least greater than 99 percent.

8. The composition of claim 7 where the solvent is ethyl lactate.

9. The composition of claim 8 wherein the ethyl lactate solvent contains less than 0.10 percent diethyl succinate.

* * * * *